United States Patent
Yoshida

(10) Patent No.: US 6,768,146 B2
(45) Date of Patent: Jul. 27, 2004

(54) III-V NITRIDE SEMICONDUCTOR DEVICE, AND PROTECTION ELEMENT AND POWER CONVERSION APPARATUS USING THE SAME

(75) Inventor: Seikoh Yoshida, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/293,470

(22) Filed: Nov. 14, 2002

(65) Prior Publication Data

US 2003/0098462 A1 May 29, 2003

(30) Foreign Application Priority Data

Nov. 27, 2001 (JP) ........................................ 2001-361184
Apr. 30, 2002 (JP) ........................................ 2002-129183
Aug. 27, 2002 (JP) ........................................ 2002-247518

(51) Int. Cl.⁷ .............................................. H01L 29/80
(52) U.S. Cl. ........................ 257/279; 257/280; 257/281
(58) Field of Search ................................. 257/279, 280, 257/281

Primary Examiner—Long Pham
(74) Attorney, Agent, or Firm—Oblon, Spivak, McClelland, Maier & Neustadt, P.C.

(57) ABSTRACT

A GaN-based Schottky diode includes a sapphire substrate on which are formed a GaN buffer layer, an $n^+$-type GaN layer, and an n-type GaN layer that has a surface portion thereof shaped to form a protrusion having an upper face with which a Ti electrode forms a Schottky junction and a side face with which a Pt electrode forms a Schottky junction through an $Al_{0.2}Ga_{0.8}N$ layer. A cathode electrode constituted by a TaSi layer forms an ohmic junction with the $n^+$-type GaN layer. The Ti and Pt electrodes constitute a combined anode electrode contributing to increasing a withstand voltage of and decreasing an on-voltage of the Schottky diode.

23 Claims, 16 Drawing Sheets

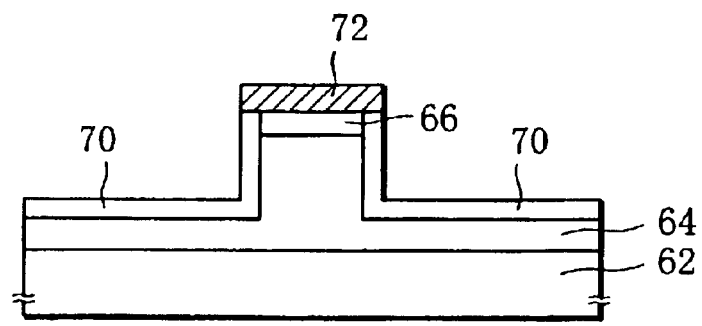
FIG. 14A
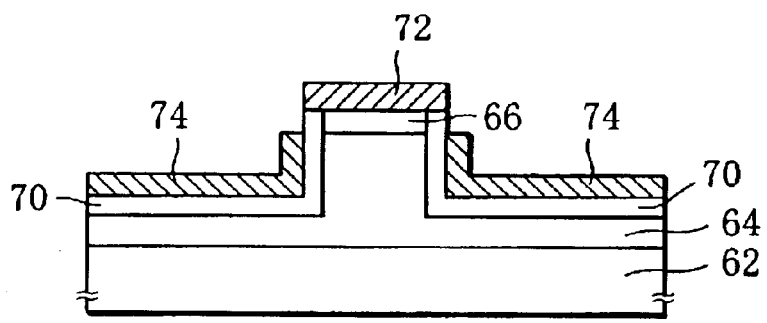
FIG. 14B
FIG. 15
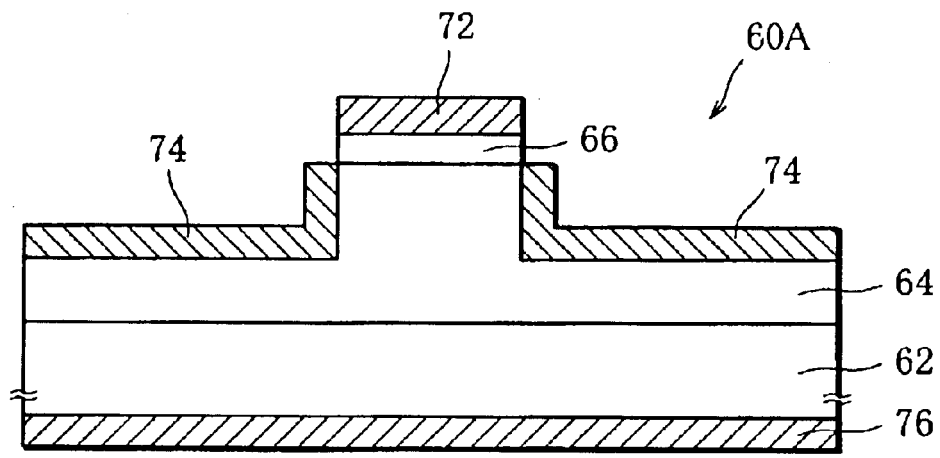

III-V NITRIDE SEMICONDUCTOR DEVICE, AND PROTECTION ELEMENT AND POWER CONVERSION APPARATUS USING THE SAME

BACKGROUND OF THE INVENTION

1. Technical Field

The present invention relates to a semiconductor device, and more particular, to a III-V nitride semiconductor device, and also relates to a protection element comprised of such a semiconductor device and used to protect a switching element of a power conversion apparatus, and to a power conversion apparatus including the protection element.

2. Related Art

A variety of electronic devices constituted by semiconductor devices are known, such as for example, a switching element for a power conversion apparatus that is constituted by a bipolar transistor having a high withstand voltage. Such a switching element for high power application is required to have a high withstand voltage and a low on-resistance. To this end, instead of a bipolar transistor, a power metal oxide semiconductor FET (power MOSFET) having a low on-resistance or an insulated gate bipolar transistor (IGBT) which is a combination of a bipolar transistor and an MOSFET has been recently employed as a switching element.

On the other hand, a power MOSFET entails a parastic bipolar transistor effect, and an FET element can be destroyed due to an inrush current or surge voltage that is applied to the MOSFET upon start of operation. Thus, a protection element for preventing a parastic effect and FET element destruction is required. For example, a zener diode of pn junction structure has been employed for protection of an Si-based MOSFET.

With a zener diode of pn junction structure, however, it is difficult to satisfactorily protect a switching element that is constituted by an MOSFET having a low on-voltage for the following reasons. That is, a zener diode of pn junction structure, having a low withstand voltage of about 100 volts, a high on-resistance of about 10 $m\Omega cm^2$ and a high on-voltage of about 1.2 volts to 1.5 volts, cannot sufficiently withstand an inrush current or surge voltage applied thereto upon start of operation of an MOSFET, can generate heat upon application of a surge voltage, and can permit an MOSFET having a low on-voltage to be destroyed before the zener diode starts to make a protecting action. Therefore, it is difficult to properly protect a switching element comprised of an MOSFET with use of a zener diode of pn junction structure, so as to ensure an operational reliability of a power conversion apparatus provided with such a switching element. Moreover, in a case where a zener diode of pn junction structure is utilized for protection of an MOSFET, a high loss can be caused to lower the efficiency of a power conversion apparatus.

It is known that a III-V nitride semiconductor device has a high withstand voltage and a low on-resistance. Thus, a further improvement of such advantages and concrete applications to electronic devices utilizing such advantages have been demanded.

SUMMARY OF THE INVENTION

An object of the present invention is to provide a III-V nitride semiconductor device having a high withstand voltage and a low on-voltage, such as a semiconductor Schottky diode and a semiconductor Schottky gate field effect transistor.

Another object of the present invention is to provide a protection element that is used for protection of a switching element for power conversion and that is constituted by a III-V nitride semiconductor device.

A further object of the present invention is to provide a power conversion apparatus that comprises a protection element constituted by a III-V nitride semiconductor device and that is highly efficiently operable with high reliability.

According to one aspect of the present invention, a GaN-based semiconductor device as a III-V nitride semiconductor device is provided. The GaN-based semiconductor device comprises: a III-V nitride semiconductor layer having a surface portion thereof shaped to form a protrusion; a first anode electrode forming a Schottky junction with an upper face of the protrusion of the III-V nitride semiconductor layer; and a second anode electrode forming a Schottky junction with a side face of the protrusion of the III-V nitride semiconductor layer and to be electrically connected with the first anode electrode, wherein a Schottky barrier formed between the first anode electrode and the III-V nitride semiconductor layer is lower in height than that formed between the second anode electrode and the III-V nitride semiconductor layer, whereby a GaN-based semiconductor device, e.g., a semiconductor Schottky diode, having a low on-voltage and high withstand voltage can be realized.

According to another aspect of the present invention, a GaN-based semiconductor device is provided, which comprises: a III-V nitride semiconductor layer having a predetermined width; a first anode electrode forming a Schottky junction with the III-V nitride semiconductor layer, with a junction width narrower than the predetermined width of the III-V nitride semiconductor layer; and a second anode electrode forming a Schottky junction with a portion of the III-V nitride semiconductor layer other than a portion at which the first anode electrode is in contact with the III-V nitride semiconductor layer, the second anode electrode being electrically connected with the first anode electrode, wherein a Schottky barrier formed between the first anode electrode and the III-V nitride semiconductor layer is lower in height than that formed between the second anode electrode and the III-V nitride semiconductor layer, whereby a semiconductor Schottky diode having a low on-voltage and high withstand voltage can be realized, as in the first-mentioned aspect of this invention.

According to still another aspect of the present invention, a III-V nitride semiconductor device is provided, which comprises: an electrically conductive substrate; a III-V nitride semiconductor layer formed on the substrate and having a surface portion thereof shaped to form a protrusion; a source electrode formed on an upper face of the protrusion of the III-V nitride semiconductor layer so as to form an ohmic junction therewith; a gate electrode formed on a side face of the protrusion so as to form a Schottky junction therewith; and a drain electrode formed on a rear face of the substrate so as to form an ohmic junction therewith, whereby a vertical semiconductor Schottky gate field effect transistor constituted by a III-V nitride semiconductor can be realized.

According to a further aspect of the present invention, there is provided a protection element for protecting a switching element constituting a power conversion circuit of a power conversion apparatus. The protection element is a GaN-based Schottky diode or GaN-based field effect transistor that has an on-voltage not higher than 1 volt and a withstand voltage not lower than 300 volts, whereby the switching element is permitted to easily operate with a low on-voltage to thereby contribute to higher efficiency of the power conversion apparatus, and the switching element is protected by an inrush current or a surge voltage applied thereto upon start of operation, thereby achieving an improved voltage withstand property and high-current operation of the switching element and improving reliability of the power conversion apparatus.

According to a further aspect of the present invention, a power conversion apparatus is provided, which comprises a power conversion circuit including a switching element; and a protection element, constituted by a GaN-based Schottky diode or a GaN-based field effect transistor, for protecting the switching element, whereby the power conversion apparatus has improved reliability and higher efficiency.

BRIEF DESCRIPTION OF THE DRAWINGS

FIG. 14A is a section view of a fifth process stage;

FIG. 14B is a section view of a sixth process stage;

FIG. 15 is a schematic section view showing a vertical GaN-based Schottky gate FET according to a second modification of the third embodiment;

DETAILED DESCRIPTION

In the following, a III-V nitride semiconductor device according to a first embodiment of the present invention will be explained.

Figure 1:
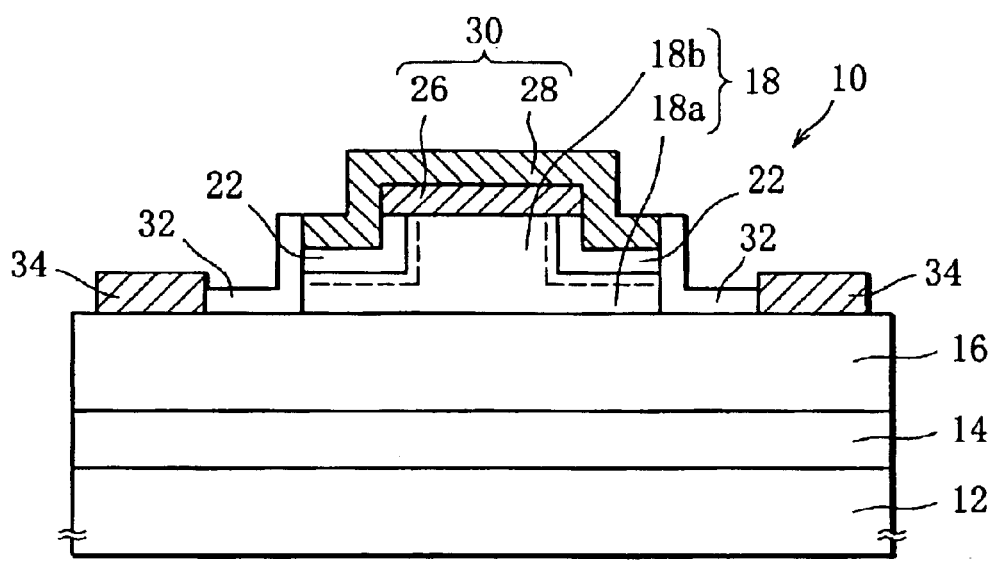
FIG. 1 is a schematic section view showing a horizontal GaN-based Schottky diode according to a first embodiment of the present invention.

As shown in FIG. 1, the semiconductor device of the first embodiment is configured as a horizontal GaN-based Schottky diode 10, which comprises an insulating or semi-insulating sapphire substrate 12, a GaN buffer layer 14 of 50 nm thick formed on the substrate 12, and an $n^+$-type GaN layer 16 of 2000 nm thick formed on the buffer layer 14. On the GaN layer 16 is formed an n-type GaN layer 18 which has a flat portion 18a of 500 nm thick and a protrusion 18B formed on a central part of a surface of the flat portion 18a. The protrusion 18b is 2000 nm in width and 2000 nm in height. The GaN buffer layer 14 has high impurity concentration of about $5 \times 10^{19}$ cm$^{-3}$, whereas the n-type GaN layer 18 has low impurity concentration of preferably not higher than $2 \times 10^{17}$ cm$^{-3}$, e.g., about $2 \times 10^{17}$ cm$^{-3}$. This is because a depletion layer, which expands in the n-type GaN layer when a reverse bias is applied to the GaN-based Schottky diode as explained below, does not expand and hence a pinch-off state cannot be realized when the impurity concentration is excessively high.

The Schottky diode 10 further comprises an undoped $Al_{0.2}Ga_{0.8}N$ layer 22 of 30 nm thick that covers a surface of the flat portion 18a and side faces of the protrusion 18b of the n-type GaN layer 18 and that has bandgap energy greater than that of the n-type GaN layer 18; a Ti (titanium) electrode 26 formed on an upper face of the protrusion 18b of the n-type GaN layer 18 so as to form a Schottky junction therewith and serving as a first anode electrode; and a Pt (platinum) electrode 28 that is formed on the Ti electrode 26 and the $Al_{0.2}Ga_{0.82}N$ layer 22 and serving as a second electrode. The Pt electrode 28 is electrically connected with the Ti electrode 26 and forms a Schottky junction with the side faces of the protrusion of the n-type GaN layer 18 through the $Al_{0.2}Ga_{0.8}N$ layer 22, and cooperates with the Ti electrode 26 to form a combined anode electrode 30.

An $SiO_2$ film 32 covers each side face of the Pt electrode 28, the $Al_{0.2}Ga_{0.8}N$ layer 22 and the flat portion of the n-type GaN layer 18, and covers inner portions of the surface of the n$^+$-type GaN layer 16. On outer portions (i.e., openings formed in the $SiO_2$ film 32) of the surface of the n$^+$-type GaN layer 16, a cathode electrode 34 is provided that is constituted by TaSi layer and forms an ohmic junction with the n$^+$-type GaN layer 16.

In the Schottky diode 10 having the above construction, the n-type GaN layer 18 and the $Al_{2.0}Ga_{0.8}N$ layer 22 are joined to each other to form a heterojunction, so that two-dimensional electron gas is produced in the vicinity of a hetero-junction face as schematically shown by dotted line in FIG. 1. Schottky barrier of 0.3 eV in height is formed at the junction face between the Ti electrode 26 and the GaN layer 18. Although the Pt electrode 28 of this embodiment does not directly form a Schottky junction with the n-type GaN layer 18, a Schottky barrier of 1.0 eV will be formed at a junction face between the Pt electrode 28 and the GaN layer 18 in an arrangement where they are directly joined to each other to form a Schottky junction.

Meanwhile, a material constituting the first anode electrode is not limited to Ti and may be metal, such as W (tungsten), Ag (silver) or the like, that forms a Schottky barrier lower than 0.8 eV relative to the n-type GaN layer 18. A material constituting the second anode electrode is not limited to Pt and may be metal, such as Ni (nickel), Pd (palladium), Au (gold) or the like, that forms a Schottky barrier higher than 0.8 eV relative to the n-type GaN layer 18.

Next, a current-voltage characteristic of the GaN-based Schottky diode 10 shown in FIG. 10 will be explained.

When a forward bias was applied to between the combined anode electrode 20 and the cathode electrode 34, a proper rising was observed such that the forward current abruptly increased at an on-voltage of 0.1–0.3 volts. The reason why such a proper forward-current rising characteristic could be obtained is considered as follows:

The on-voltage required to permit the forward current to rise is generally about 0.3–0.5 volts when the forward bias is applied to between a Ti electrode and an n-type GaN layer that form a Schottky junction, whereas it is generally about 1.0–1.5 volts for a case where a Pt electrode and an n-type GaN layer form a Schottky junction.

In the GaN-based Schottky diode 10 of this embodiment, at an initial stage of the forward current rising, the Ti electrode 26, forming a Schottky junction with the n-type GaN layer 18, of the combined anode electrode 30 mainly serves as the anode electrode, and hence the on-voltage of the Schottky diode 10 has a value closer to about 0.3–0.5 volts, corresponding to that of a Ti electrode forming a Schottky junction with an n-type GaN layer, rather than about 1.0–1.5 volts corresponding to that of a Pt electrode forming a Schottky junction with an n-type GaN layer. In addition, a two-dimensional electron gas, produced in the vicinity of the heterojunction face between the n-type GaN layer 18 and the $Al_{0.2}Ga_{0.8}N$ layer 22, serves as carriers and contributes to increasing the forward current, and therefore, the on-voltage decreases to 0.1–0.3 volts lower than about 0.3–0.5 volts for a case where no $Al_{0.2}Ga_{0.8}N$ layer 22 is provided, whereby the aforementioned proper forward-current rising characteristic is achieved. At a stage where the forward bias reaches about 1.0–1.5 volts, both the Ti electrode 26 and the Pt electrode 28 serve as an anode electrode.

When a reverse bias was applied to between the combined anode electrode 30 and the cathode electrode 34, a high withstand voltage of about 500 volts was observed. It is considered that the reason why such a high withstand voltage can be obtained is as follows:

In general, a reverse leakage current of about $10^{-6}$ to $10^{-5}$ amperes is produced when a reverse bias of $-10$ volts is applied between a Ti electrode and an n-type GaN layer that form a Schottky junction. Between a Pt electrode and an n-type GaN layer that form a Schottky junction, a reverse leakage current far smaller than that is produced, resulting in a withstand voltage of about 500 volts.

When a reverse bias is applied to the GaN-based Schottky diode 10 according to the present embodiment, a first depletion layer expands in the vicinity of the upper face of the protrusion 18b of the n-type GaN layer 18 that forms a Schottky junction with the Ti electrode 26, whereas a second depletion layer expands in the vicinity of the side faces of the protrusion 18b that form a Schottky junction with the Pt electrode 28 through the $Al_{0.2}Ga_{0.8}N$ layer 22.

In a stage where the reverse bias voltage is lower than $-10$ volts, almost no reverse leakage current is produced that flows through the first depletion layer formed on the side faces of the protrusion 18b, whereas a reverse leakage current passing through the second depletion layer formed in the upper face of the protrusion 18b increases with the increase of the reverse bias. A degree of expansion of the second depletion layer caused by the Schottky junction between the Pt electrode 28 and the side faces of the protrusion is greater than that of expansion of the first depletion layer caused by the Schottky junction between the Ti electrode 26 and the upper face of the protrusion. Since the $Al_{0.2}Ga_{0.8}N$ layer 22 having bandgap energy higher than that of the n-type GaN layer 18 is interposed between the Pt electrode 28 and the side faces of the protrusion 18b, the degree of expansion of the second depletion layer further increases. As a consequence, when the reverse bias voltage increases to about $-10$ volts, the second depletion layers respectively expanding from the side faces of the protrusion 18b are brought in contact with each other, resulting in a pinch-off state. Thus, the reverse leakage current is prevented from passing through the first depletion layer in the vicinity of the upper face of the protrusion 18b of the n-type GaN layer 18. When the reverse bias further increases, only the Pt electrode 28 of the combined anode electrode 30 serves as an anode electrode, whereby a proper withstand voltage of about 500 volts can be attained.

With reference to FIGS. 2A to 2E and FIGS. 3A to 3C, an exemplified method for manufacturing the Schottky diode 10 shown in FIG. 1 will be explained.

First, a series of crystal growth on an insulating or semi-insulating sapphire substrate 12 is done at a growth temperature of 640° C. by means of a gas source molecular beam epitaxy (GS-MBE) method using an ultra-high vacuum growth apparatus.

More specifically, a GaN buffer layer 14 of 50 nm thick is grown, using as raw material gases, gallium (Ga) at a partial pressure of $6.65 \times 10^{-5}$ Pa and radical nitrogen (N) at a partial pressure of $4 \times 10^{-4}$ Pa. In succession, an $n^+$-type GaN layer 16 of 2000 nm thick with high impurity concentration of about $5 \times 10^{19}$ cm$^{-3}$ is grown, using Ga at a partial pressure of $1.33 \times 10^{-4}$ Pa, NH$_3$ (ammonia) at a partial pressure of $6.65 \times 10^{-4}$ Pa, and Si (silicon), as a dopant, at a partial pressure of $1.33 \times 10^{-6}$ Pa.

In succession, an n-type GaN layer 18 of 2500 nm thick with low impurity concentration of about $2 \times 10^{17}$ cm$^{-3}$ is grown, using Ga at a partial pressure of $1.33 \times 10^{-4}$ Pa, NH$_3$ at a partial pressure of $6 \times 10^{-4}$ Pa, and Si, as a dopant, at a partial pressure of $2 \times 10^{-7}$ Pa. As a result, a first intermediate product is formed in which the GaN buffer layer 14, the $n^+$-type GaN layer 16, and the n-type GaN layer 18 are layered on the sapphire substrate 12 (see FIG. 2A).

After the first intermediate product is temporally taken out from the ultra-high vacuum growth apparatus, an SiO$_2$ film is formed on the n-type GaN layer 18 by, e.g., the plasma chemical vapor deposition (CVD) method. Instead of the SiO$_2$ film, an SiN$_x$ film or AlN film may be formed. In succession, patterning of the SiO$_2$ film is conducted by wet etching with, e.g., BHF or dryetching with CF$_4$, thereby forming an SiO$_2$ pattern 20 of, e.g., 2 μm thick (see FIG. 2B).

Then, using the SiO$_2$ pattern 20 as a mask, the n-type GaN layer 18 is selectively removed by an electron cyclotron resonance (ECR) plasma etching method or a reactive ion beam etching (RIBE) method with a methane series gas, thereby forming a protrusion (shown by reference numeral 18b in FIG. 1) of 2000 nm height at a central portion of a surface of a flat portion (shown by reference numeral 18a in FIG. 1) of the n-type GaN layer 18. Thus, a second intermediate product provided with the GaN layer 18 having the flat portion and the protrusion is formed (see FIG. 2C).

Next, the second intermediate product is mounted in the ultra-high vacuum growth apparatus. Then, using the SiO$_2$ pattern 20 as a mask, an undoped Al$_{0.2}$Ga$_{0.8}$N layer 22 of 30 nm thick is selectively grown on the n-type GaN layer 18, using Ga at a partial pressure of $6.65 \times 10^{-5}$ Pa and NH, at a partial pressure of $6.65 \times 10^{-4}$ Pa. As a result, a third intermediate product is formed in which the surface of the flat portion and side faces of the protrusion of the n-type GaN layer 18 are covered by the Al$_{0.2}$G$_{0.8}$N layer 22 (see FIG. 2D).

Next, the SiO$_2$ pattern 20 is removed after the third intermediate product is taken out from the ultra-high vacuum growth apparatus. In succession, an SiO$_2$ film (not shown) is formed on the entire face of the third intermediate product, and then patterning of the SiO$_2$ film is conducted by the photolithography and etching method, to form an SiO$_2$ pattern 24 that covers an upper face of the protrusion of the n-type GaN layer 18 and a surface of the Al$_{0.2}$G$_{0.8}$N layer 22 (see FIG. 2E).

Figure 3A:
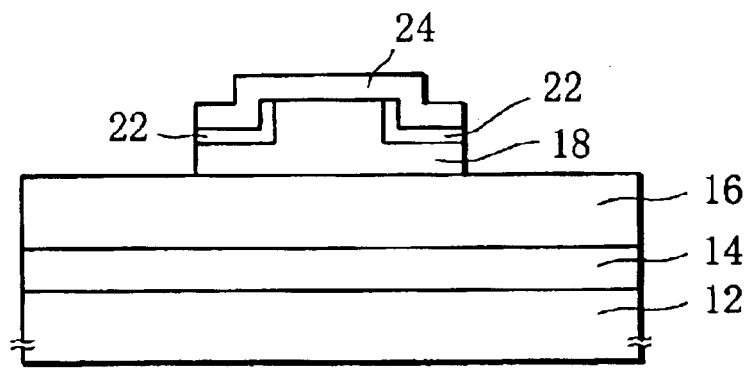
FIG. 3A is a section view showing a sixth process stage following the fifth process stage shown in FIG. 2E.

Then, using the SiO$_2$ pattern 24 as a mask, the Al$_{0.2}$G$_{0.8}$N layer 22 and the n-type GaN layer 18 are selectively removed by the ECR plasma etching method or the RIBE method with a methane series gas, thereby making outer portions of a surface of the $n^+$-type GaN layer 16 exposed (see FIG. 3A).

Next, the SiO$_2$ pattern 20 is removed. In succession, a Ti electrode 26 is formed by the lift-off method, which forms a Schottky junction with the upper face of the protrusion of the n-type GaN layer 18. Specifically, a resist film (not shown) is applied so as to cover the upper face of the protrusion of the n-type GaN layer 18 and the surfaces of the Al$_{0.2}$Ga$_{0.8}$N layer 18 and the $n^+$-type GaN layer 16, and then patterning of the resist film is conducted by photolithography to form the resist film with an opening through which the upper face of the protrusion of the n-type GaN layer 18 is exposed. In succession, a Ti film is deposited on the resist film within the openings by means of an evaporation method, and then the Ti film on the resist film is removed together with the resist film. As a result, a Ti electrode 26 is formed, with the Ti film on the upper face of the protrusion of the n-type GaN layer 18 kept remained (see FIG. 3B).

Figure 3B:
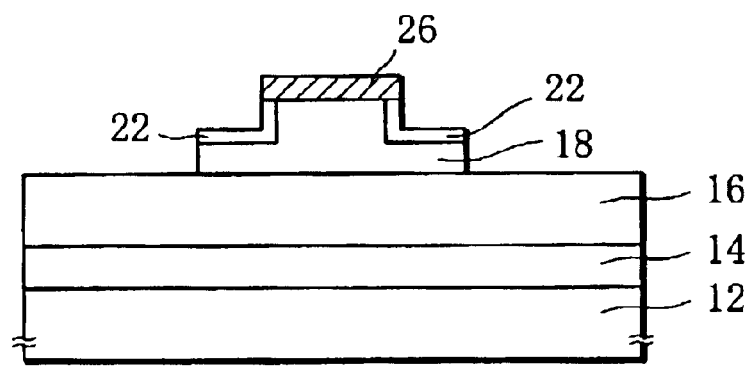
FIG. 3B is a section view of a seventh process stage.
Figure 3C:
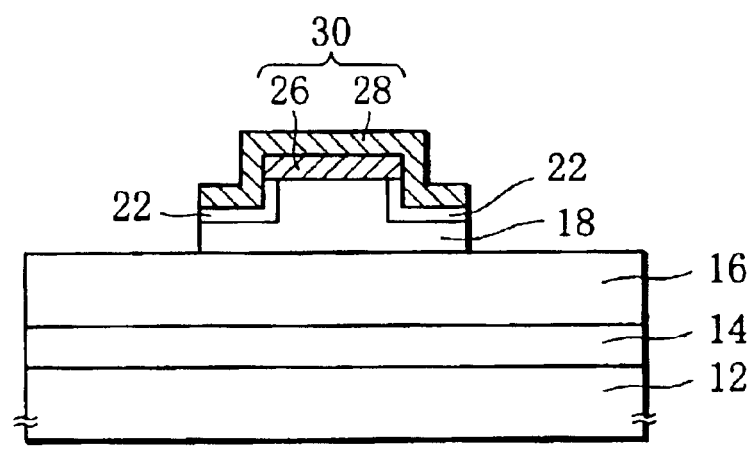
FIG. 3C is a section view of an eighth process stage.

Next, as in the process stage shown in FIG. 3B, a Pt layer is selectively formed on the Ti electrode 26 and the Al$_{0.2}$G$_{0.8}$N layer 22, thereby forming a Pt electrode 28 that is electrically connected with the Ti electrode 26 and forms a Schottky junction with the side faces of the protrusion of the n-type GaN layer 18 through the Al$_{0.2}$Ga$_{0.8}$N layer 22. The Ti and Pt electrodes 26, 28 constitute a combined electrode 30 (see FIG. 3C).

Next, an SiO$_2$ film 32 is formed that covers surfaces or side faces of the Pt electrode 28, Al$_{0.2}$Ga$_{0.8}$N layer 22, n-type GaN layer 18 and $n^+$-type GaN layer 16. Whereupon, the SiO$_2$ film 32 is selectively removed by the photolithography and etching method, so that the surface of the Pt electrode 28 are exposed, with the surface of the $n^+$-type GaN layer 16 partly exposed. Then, a TaSi layer is formed on the exposed parts of the $n^+$-type GaN layer 16 by the lift-off method, to thereby form a cathode electrode 34 constituted by the TaSi layer and forming an ohmic junction with the $n^+$-type GaN layer 16. With the aforementioned series of processes, the Schottky diode 10 shown in FIG. 1 is fabricated.

In the following, another example of a manufacturing method for the Schottky diode 10 shown in FIG. 1 will be explained.

Figure 2A:
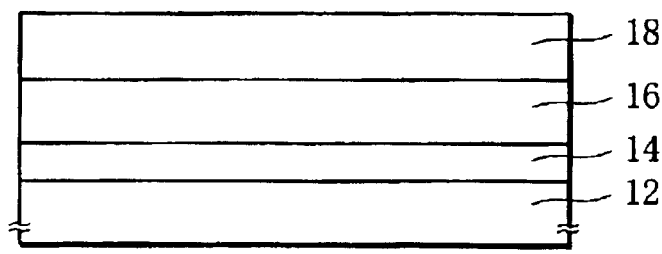
FIG. 2A is a schematic section view showing a first process stage of a method for manufacturing the GaN-based Schottky diode shown in FIG. 1.
Figure 2B:
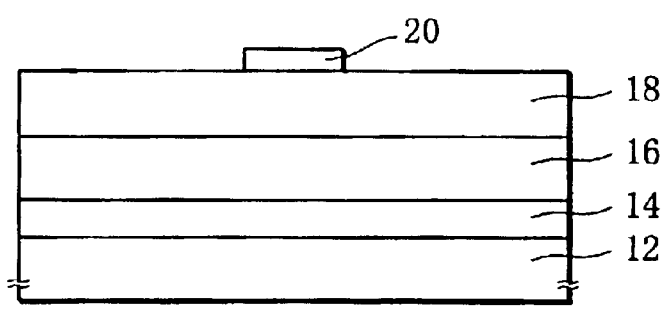
FIG. 2B is a section view showing a second process stage of the manufacturing method.
Figure 2C:
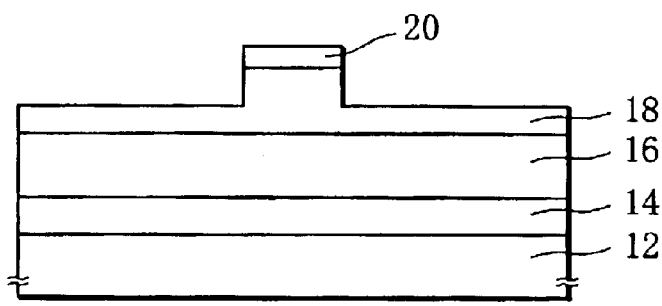
FIG. 2C is a section view showing a third process stage.
Figure 2D:
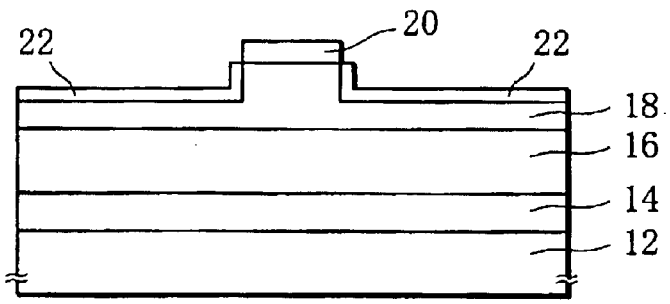
FIG. 2D is a section view of a fourth process stage.
Figure 2E:
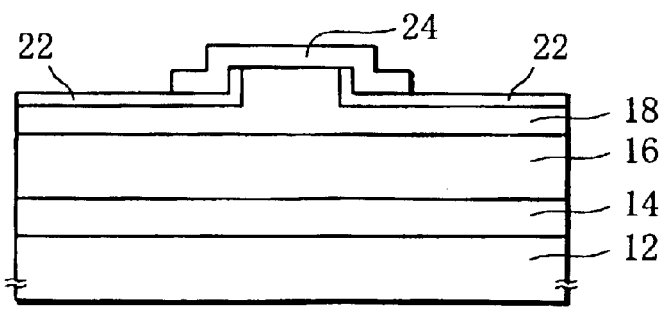
FIG. 2E is a section view of a fifth process stage.

First, as in the process stage shown in FIG. 2A, a GaN buffer layer 14 and an $n^+$-type GaN layer 16 are sequentially layered on a sapphire substrate 12, and an n-type GaN layer 18a of 500 nm thick is layered on the $n^+$-type GaN layer 16 under the same conditions as those for the n-type GaN layer 18 shown in FIG. 2A.

Figure 4A:
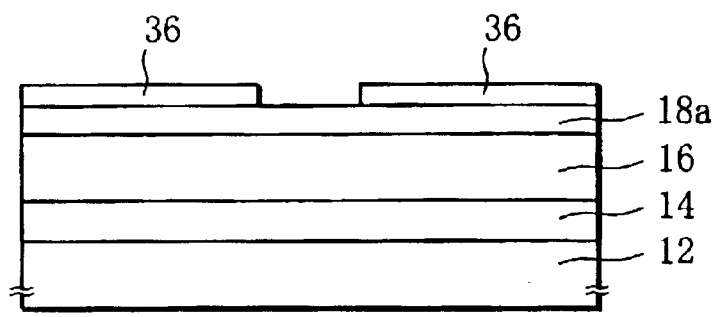
FIG. 4A is a schematic sectional view showing a second process stage of another manufacturing method for the GaN-based Schottky diode shown in FIG. 1.

Next, an SiO$_2$ film 36 is formed on the n-type GaN layer 18a by, e.g., the plasma CVD method. Instead of the SiO$_2$ film 36, an SiN$_x$ film or AlN film may be formed. In succession, the SiO$_2$ film 36 is selectively etched by means of the wet etching method with BHF or the dryetching method with CF$_4$, thereby forming an opening of 2 μm width in the SiO$_2$ film 36 (see FIG. 4A).

Figure 4B:
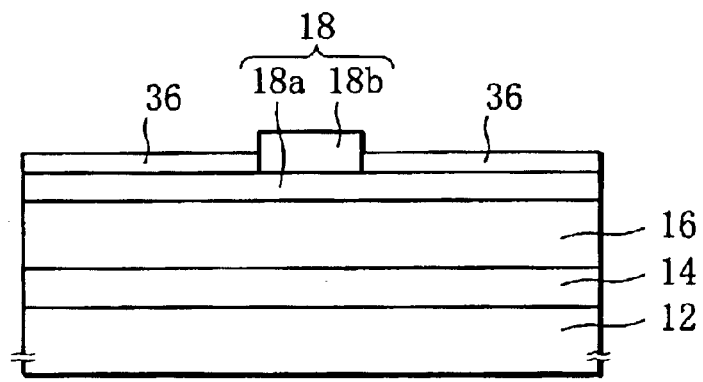
FIG. 4B is a section view of a third process stage of the manufacturing method.

Next, using the SiO$_2$ film 36 as a mask, an n-type GaN layer 18b of 2000 nm thick is grown on that part of the n-type GaN layer 18a which is within the opening under the same conditions as those for the n-type GaN layer 18a. The n-type GaN layers 18a, 18b constitute an n-type GaN layer 18 having a surface thereof formed at a central part with a protrusion of 2000 nm height (see FIG. 4B).

With processes similar to those shown in FIGS. 2D, 2E, 3A, 3B and 3C, the Schottky diode 10 shown in FIG. 1 is fabricated.

The Schottky diode 10, having the combined anode electrode 30 which is a combination of the Ti and Pt electrodes 26, 28 that form Schottky junctions with the upper face and the side faces of the protrusion of the n-type GaN layer 18, respectively, can simultaneously achieve a low on-voltage and a high withstand voltage.

In addition, the undoped $Al_{0.2}Ga_{0.8}N$ layer 22 with a high bandgap energy interposed between the Pt electrode 28 and the side faces of the protrusion of the n-type GaN layer 18 can produce two-dimensional electron gas in the vicinity of the heterojunction face between the n-type GaN layer 18 and the $Al_{0.2}Ga_{0.8}N$ layer 22 to increase the forward current, further improving a proper forward-current rising characteristic, and can broaden a depletion layer by the Schottky junction between the Pt electrode 28 and the side faces of the protrusion of the n-type GaN layer 18, whereby a proper withstand voltage characteristic is further improved.

The width of the protrusion 18b of the n-type GaN layer 18, which has a value of 2000 nm in the first embodiment, may vary in dependence on the desired characteristics of the Schottky diode 10. Specifically, the protrusion 18b should have a greater width in order to increase the forward current, but have a smaller width in order to reduce a reverse bias as small as possible that is required to attain a pinch-off state where depletion layers individually expanding from both the side faces of the protrusion 18b to be in contact with each other to thereby prevent a reverse leakage current from passing through the depletion layer on the side of the upper face of the protrusion 18b. Accordingly, in actual, the width of the protrusion of the n-type GaN layer 18 is so determined as to meet requirements on the two characteristics (i.e., the forward current characteristic and the reverse leakage current characteristic) between which a trade-off relation exists. This applies to the below-mentioned embodiments and their modifications.

The Schottky diode 10 of the first embodiment may be modified variously.

For instance, instead of the $Al_{0.2}Ga_{0.8}N$ layer 22 in the Schottky diode 10, an undoped GaN layer of 50 nm thick may be provided so as to be interposed between the Pt electrode 28 and the side faces of the protrusion of the n-type GaN layer 18. A Schottky diode according to this first modification can be fabricated as with the case of the first embodiment, and hence an explanations on a method for manufacturing the same will be omitted. This applies to the below-mentioned modifications.

With the Schottky diode according to the first modification, the manner of expanding a depletion layer at the side faces of the protrusion of the n-type GaN layer greatly varies depending on the presence of the undoped GaN layer. For this reason, not only a low on-voltage and a high withstand voltage can be attained simultaneously as in the first embodiment, but also the degree of expansion of the depletion layer can be further increased due to the Schottky junction between the undoped GaN layer and the Pt electrode 28, making it possible to further improve a proper voltage withstand characteristic.

Figure 5:
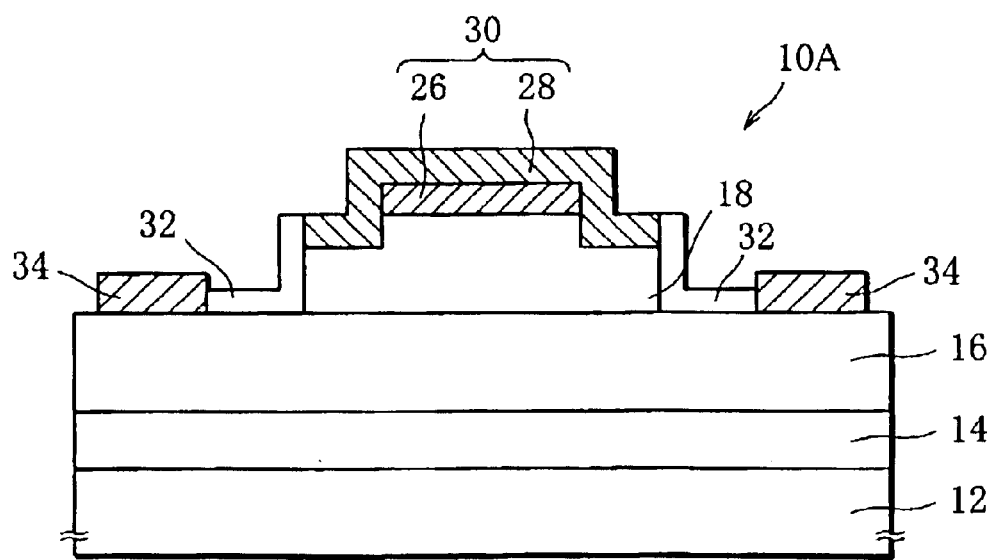
FIG. 5 is a schematic section view showing a Schottky diode according to a second modification of the first embodiment.

FIG. 5 shows a GaN-based Schottky diode 10A according to a second modification of the first embodiment. As compared with the Schottky diode 10 (FIG. 1) of the first embodiment, the Schottky diode 10A is different in that the $Al_{0.2}Ga_{0.8}N$ layer 22 is removed, and hence the Pt electrode 28 is directly joined to the side faces of the protrusion of the n-type GaN layer 18 to form a Schottky junction. The Schottky diode 10A is simplified in construction and in manufacturing process substantially by the absence of the $Al_{0.2}Ga_{0.8}N$ layer 22.

Figure 6:
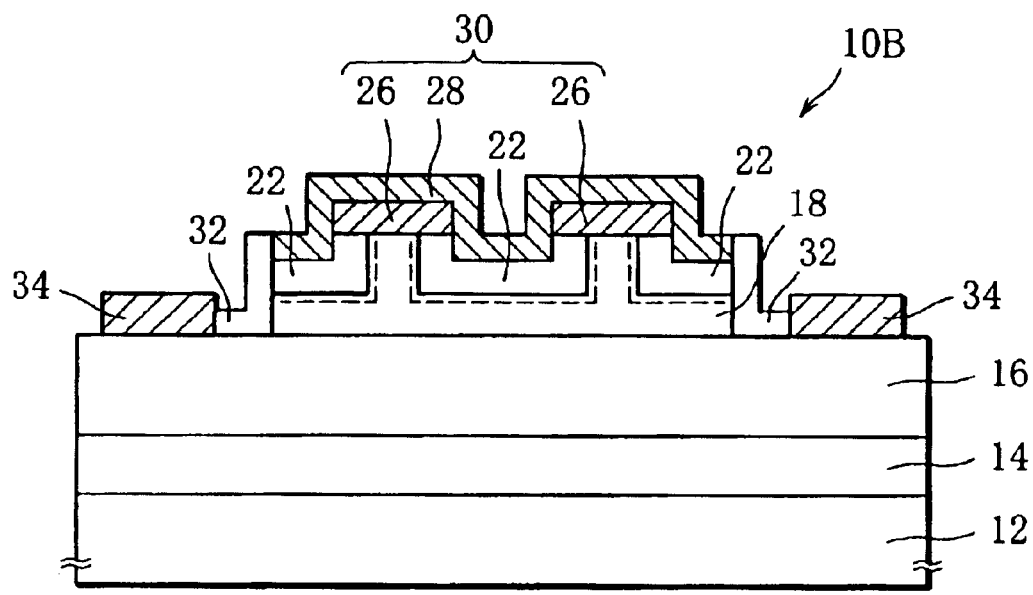
FIG. 6 is a schematic section view showing a Schottky diode according to a third modification of the first embodiment.

FIG. 6 shows a Schottky diode 10B according to a third modification of the first embodiment, which diode is mainly different from the Schottky diode 10 (FIG. 1) in that two protrusions are formed on a surface of the n-type GaN layer. An $Al_{0.2}Ga_{0.8}N$ layer 22 is formed on a surface of a flat portion and side faces of the two protrusions of the n-type GaN layer 18, with two Ti electrodes 26 individually formed on upper faces of the two protrusions and with a Pt electrode 28 formed on the two Ti electrodes 26 and the $Al_{0.2}Ga_{0.8}N$ layer 22.

As compared with the Schottky diode 10, the Schottky diode 10B has the increased number of protrusions from one to two, each constituting a current path, and accordingly achieves such an advantage that the forward current increases upon application of the forward bias between a combined electrode 30 and a cathode electrode 34.

With the Schottky diode 10B, each protrusion is permitted to have a smaller width as compared with that of the Schottky diode 10, making it possible to further reduce a reverse bias required for preventing a reverse leakage current from passing through a depletion layer formed at the upper face of the protrusion, thereby improving the voltage withstand characteristic. Specifically, by increasing the number of protrusion and at the same time by decreasing the width of the protrusion, the forward current characteristic and the reverse leakage current characteristic between which the aforementioned trade-off relation exists can be simultaneously satisfied. The number of protrusions of the n-type GaN layer 18 is not limited to two, but may be three or more. This applies to the below-mentioned embodiments and their modifications.

Next, a Schottky diode according to a fourth modification of the first embodiment is provided with an undoped GaN layer mentioned in the first modification, instead of the $Al_{0.2}Ga_{0.8}N$ layer 22 for the Schottky diode 10B (FIG. 6) according to the third modification. In this manner, the Schottky diode of the fourth modification has its construction corresponding to a combination of those for the first and third modifications, thus achieving a proper voltage withstand characteristic and at the same time increasing the forward current.

Figure 7:
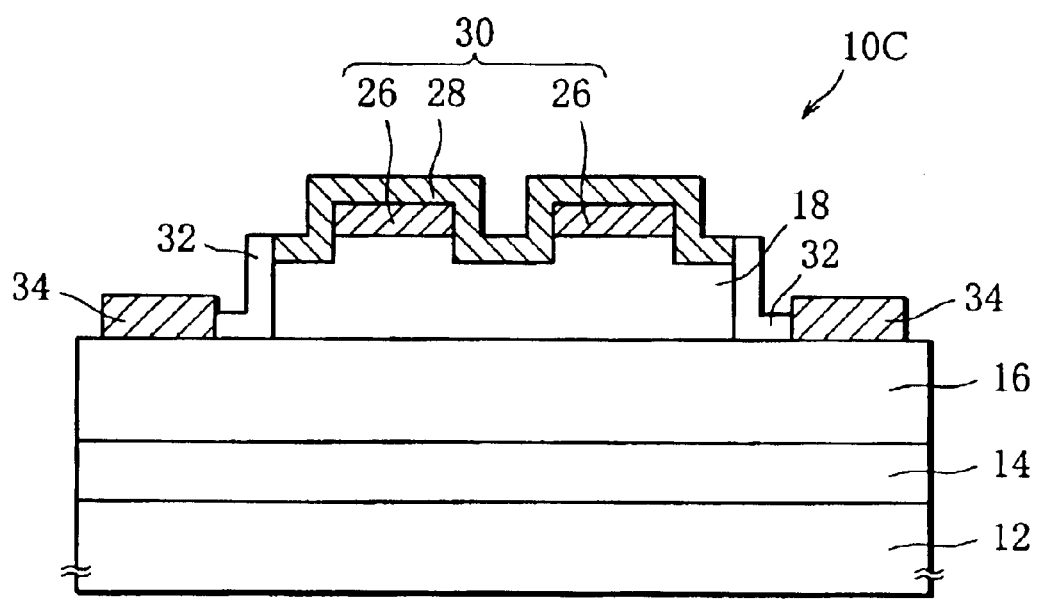
FIG. 7 is a schematic section view showing a Schottky diode according to a fifth modification of the first embodiment.

FIG. 7 shows a Schottky diode 10C according to a fifth modification of the first embodiment, which is different from the Schottky diode 10B (FIG. 6) of the third modification in that the $Al_{0.2}Ga_{0.8}N$ layer 22 is removed, with a Pt electrode 28 being directly joined to side faces of a protrusion of a GaN layer 18 to form a Schottky junction, as in the case of the second modification. Thus, the Schottky diode 10C has a construction corresponding to a combination of the second and third modifications, and is hence simplified in construction and its manufacturing process, with such an advantage that the forward current can be increased.

In the following, a vertical GaN-based Schottky diode according to a second embodiment of this invention will be explained.

Figure 8:
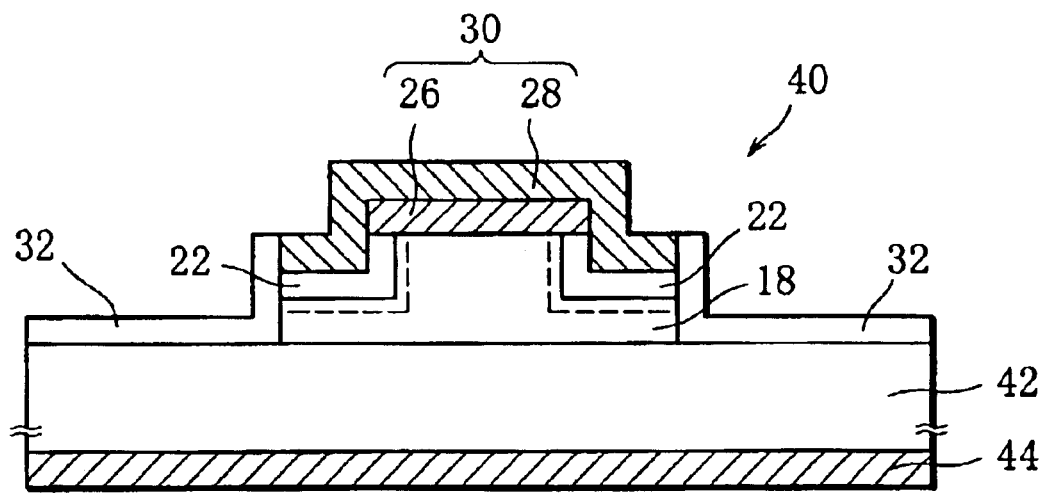
FIG. 8 is a schematic section view showing a vertical GaN-based Schottky diode according to a second embodiment of the present invention.

As shown in FIG. 8, the Schottky diode 40 of the second embodiment comprises an electrically conductive n-type SiC substrate 42, which is provided in place of the sapphire substrate 12, GaN buffer layer 14 and n+-type GaN layer 16 of the horizontal Schottky diode 10 (FIG. 1) of the first embodiment, and a cathode electrode 44 constituted by a TaSi layer and formed on a rear face of the SiC substrate 42 so as to form an ohmic junction therewith, which is provided in place of the cathode electrode 34 shown in FIG. 1, so that the diode 40 has a vertical construction.

On the SiC substrate 42 are formed a GaN layer 18, an undoped $Al_{0.2}Ga_{0.8}N$ layer 22, a Ti electrode 22, a Pt electrode 28 and an $SiO_2$ film 32, in which the electrodes 22 and 28 constitute a combined electrode 30. The elements 18, 22, 26, 28 and 32 are the same in construction and function, and explanations thereon will be omitted.

The Schottky diode 40 has substantially the same current-voltage characteristic as that of the first embodiment. Specifically, a proper rising such that the forward current abruptly increased at an on-voltage of 0.1–0.3 volts was observed when a forward bias was applied to between the combined anode electrode 30 and the cathode electrode 44. Also, a high withstand voltage of about 500 volts was observed when a reverse bias was applied to between these electrodes 30, 44. It is considered that the Schottky diode 40 has such a low on-voltage and a high withstand voltage for the same reasons as those for the first embodiment.

The Schottky diode 40 can be fabricated substantially the same manner as in the first embodiment. Briefly speaking, after an n-type GaN layer 18 is grown on an n-type SiC substrate 42 by means of, e.g., the gas source MBE method using an ultra-high vacuum growth apparatus, the n-type GaN layer 18 is selectively removed by etching to thereby form a protrusion 18b, and then an undoped Al0.2Ga0.8N layer 22 is grown. In succession, Ti and Pt electrodes 48, 50 are formed on upper and side faces of the protrusion of the n-type GaN layer 44, respectively, and an $SiO_2$ film 32 is formed. Finally, a cathode electrode 54 is formed on a rear face of the n-type SiC substrate 42, whereby the fabrication of a Schottky diode 40 is completed.

Although the Schottky diode 40 of the second embodiment having a vertical structure differs from the horizontal Schottky diode 10 of the first embodiment, these diodes have a common basic structure such that they have the combined electrode 30 that is comprised of the Ti electrode 26 forming a Schottky junction with the upper face of the protrusion of the n-type GaN layer 18 and the Pt electrode 28 forming a Schottky junction with the side faces of the protrusion through the $Al_{0.2}Ga_{0.8}N$ layer 22. Accordingly, the Schottky diode 40 achieves the same advantages as those attained by the Schottky diode 10.

The Schottky diode 40 of the second embodiment may be modified in various manner.

The below-mentioned first to fifth modifications of the second embodiment correspond to the first to fifth modifications of the first embodiment, respectively. The Schottky diode of each modification that comprises an n-type SiC substrate (shown at 42 in FIG. 8), which is provided instead of the sapphire substrate 12 provided in a corresponding modification of the first embodiment, and a cathode electrode (shown at 44 in FIG. 8) formed on a rear face of the SiC substrate 42. In other words, each Schottky diode is obtainable by further modifying the diode according to a corresponding modification of the first embodiment from a horizontal structure into a vertical one, and are hence similar in characteristic to the corresponding modification and can be manufactured in the same manner.

More specifically, a Schottky diode according to a first modification of the second embodiment comprises an undoped GaN layer formed instead of the $Al_{0.2}Ga_{0.8}N$ layer 22 for the Schottky diode 40. The undoped GaN layer is interposed between a Pt electrode 28 and an n-type GaN layer 18, whereby the voltage withstand characteristic is improved.

Figure 9:
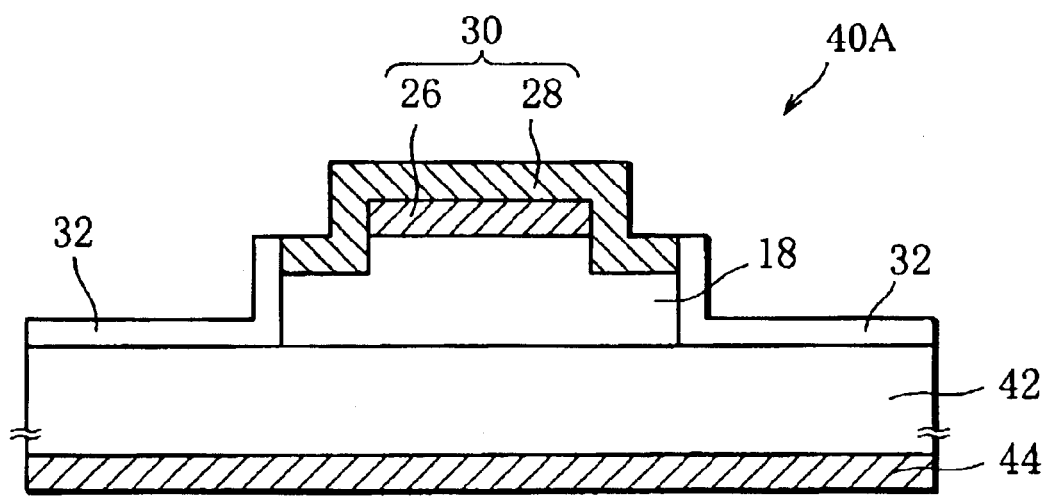
FIG. 9 is a schematic section view of a Schottky diode according to a second modification of the second embodiment.

Referring to FIG. 9, a Schottky diode 40A according to a second modification of the second embodiment is different from the Schottky diode (shown at 40 in FIG. 8) of the second embodiment in that an $Al_{0.2}Ga_{0.8}N$ layer 22 is removed, thus having a simplified structure.

Figure 10:
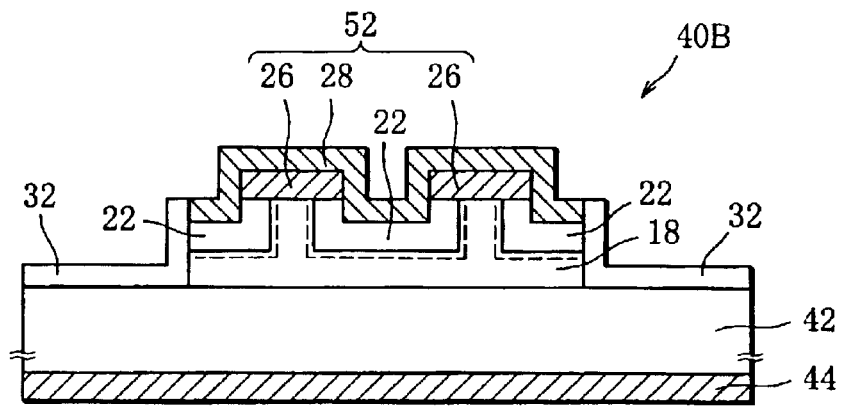
FIG. 10 is a schematic section view of a Schottky diode according to a third modification of the second embodiment.

As shown in FIG. 10, a Schottky diode 40B according to a third modification of the second embodiment is mainly different from the Schottky diode 44 in that two protrusions are formed on a surface of an n-type GaN layer 18, thus capable of increasing the forward current upon application of the forward bias between a combined anode electrode 30 and a cathode electrode 44.

A Schottky diode according to a fourth modification of the second embodiment comprises an undoped GaN layer formed instead of the $Al_{0.2}Ga_{0.8}N$ layer 22 for the Schottky diode 40B shown in FIG. 10, whereby the voltage withstand characteristic is improved and the forward current can be increased.

Figure 11:
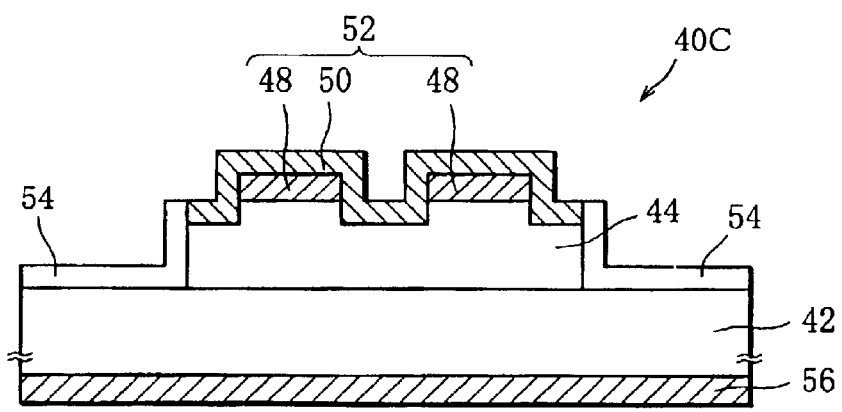
FIG. 11 is a schematic section view of a Schottky diode according to a fifth modification of the second embodiment.

Referring to FIG. 11, a vertical GaN-based Schottky diode 40C according to a fifth modification of the second embodiment differs from the Schottky diode 40B shown in FIG. 10 in that the $Al_{0.2}Ga_{0.8}N$ layer 22 is removed, whereby the construction is simplified.

In the following, a vertical GaN-based Schottky gate FET according to a third embodiment of the present invention will be explained.

Figure 12:
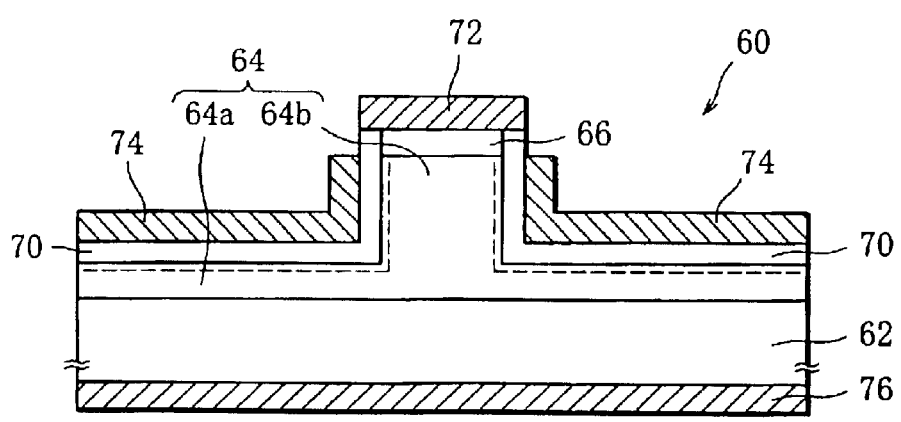
FIG. 12 is a schematic section view showing a vertical GaN-based Schottky gate FET according to a third embodiment of the present invention.

As shown in FIG. 12, the Schottky gate FET 60 comprises, e.g., an electrically conductive n-type SiC substrate 62 and an n-type GaN layer 64 formed on the substrate 62 and comprised of a flat portion 64a of 500 nm thick and a protrusion 64b, which protrusion is formed at a central part of a surface of the flat portion 64a and which is 2000 nm in width and 2000 nm in height. The impurity concentration of the n-type GaN layer 64 is not greater than $2 \times 10^{17}$ cm$^{-3}$, e.g., equal to $2 \times 10^{17}$ cm$^{-3}$.

An n+-type GaN layer 66 of 50 nm thick with high impurity concentration of about $5 \times 10^{19}$ cm$^{-3}$ is formed on an upper face of the protrusion 64b of the n-type GaN layer 64. The surface of the flat portion and side faces of the protrusion of the n-type GaN layer 64 as well as side faces of the n+-type GaN layer 66 are covered by an undoped $Al_{0.2}Ga_{0.8}N$ layer 70 of 30 nm thick having bandgap energy higher than that of the n-type GaN layer 64 that makes the heterojunction with the $Al_{0.2}Ga_{0.8}N$ layer 70 so that two-dimensional electron gas is produced in the vicinity of the heterojunction face as schematically shown by dotted line in FIG. 12.

As explained later, the protrusion 64b of the n-type GaN layer 64 constitutes a channel region through which the drain current $I_D$ flows in the vertical direction. The two dimensional electron gas serves as carriers when the drain current $I_D$ flows through the channel region. Thus, the Schottky gate FET 60 has a vertical HEMT structure.

Furthermore, a source electrode 72 constituted by a TaSi layer is formed on the n+-type GaN layer 66, so that the source electrode 72 forms an ohmic junction with the upper face of the protrusion 64b of the n-type GaN layer 64 through the n+-type GaN layer 66. A Schottky gate electrode 74 constituted by a Pt layer is formed on the side faces of the protrusion 64b so as to form a Schottky junction therewith. A material constituting the Schottky gate electrode 74 is not limited to Pt, but may be metal, such as Ti, Ni, W, Ag, Pd, Au, that can form Schottky barrier with respect to the n-type GaN layer 64. Preferably, the Schottky gate electrode 74 is constituted by metal that can form a higher Schottky barrier. Furthermore, a drain electrode 76 comprised of a TaSi layer is formed on a rear face of the n-type SiC substrate 62 to form an ohmic junction therewith.

Next, the current-voltage characteristic of the Schottky gate FET 60 shown in FIG. 12 will be explained.

Since the Schottky gate electrode 74 is formed on the side faces of the protrusion of the n-type GaN layer 64, with the $Al_{0.2}Ga_{0.8}N$ layer 70 interposed therebetween, depletion layers are formed in the vicinity of the side faces of the protrusion even if the gate voltage $V_G$ applied to the Schottky gate electrode 74 is at zero volts. When a predetermined drain voltage $V_D$ is applied between the source electrode 72 and the drain electrode 76 under this condition, a drain current $I_D$ vertically flows through a region, serving as a channel, between the depletion layers existing along the side faces of the protrusion of the n-type GaN layer 64. With the increasing drain voltage $V_D$, the width of the channel increases and the drain current $I_D$ also increases.

By increasing or decreasing the gate electrode $V_G$, the degree of expansion of the depletion layers along the side faces of the protrusion of the n-type GaN layer 64 is varied, so that the width of the channel between the depletion layers varies. In this manner, the channel width is controlled by the gate voltage $V_G$, and hence the drain current $I_D$ flowing therethrough is controlled.

At this time, two-dimensional electron gas produced in the vicinity of the heterojunction between the n-type GaN layer 64 an the $Al_{0.2}Ga_{0.8}N$ layer 70 serves as carrier to thereby contribute to the drain current $I_D$, and accordingly, a proper rising characteristic such that the drain current $I_D$ abruptly rises with a small drain voltage $V_D$.

Since the undoped $Al_{0.2}Ga_{0.8}N$ layer 70 having bandgap energy higher than that of the n-type GaN layer 64 is provided between the Schottky gate electrode 74 and the GaN layer 64, the depletion layers can widely expand with a small gate voltage $V_G$, thus improving the controllability of the drain current $I_D$ by means of the gate voltage $V_G$.

With reference to FIGS. 13A–13D, 14A and 14B, an exemplified method for manufacturing the Schottky gate FET 60 shown in FIG. 12 will be explained.

First, a series of crystal growth is performed on an electrically conductive n-type SiC substrate 62 by means of the gas source MBE method using an ultra-high vacuum growth apparatus.

More specifically, an n-type GaN layer 64 of 2500 nm thick having a low impurity concentration of about $2 \times 10^{17}$ cm$^{-3}$ is grown by using, as material gasses, Ga, NH$_3$, and Si (serving as a dopant) at partial pressures of $1.33 \times 10^{-5}$ Pa, $6.65 \times 10^{-4}$ Pa and $2 \times 10^{-7}$ Pa, respectively. In succession, an n$^+$-type GaN layer 66 of 50 nm thick having a high impurity concentration of $5 \times 10^{19}$ cm$^{-3}$ is grown with use of Ga, NH$_3$ and Si (as a dopant) at partial pressures of $1.33 \times 10^{-5}$ Pa, $6.65 \times 10^{-4}$ Pa and $1.33 \times 10^{-6}$ Pa, respectively (see FIG. 13A).

Next, an SiO$_2$ film is formed on the n$^+$-type GaN layer 66 by, e.g., the plasma CVD method. In succession, patterning of the SiO$_2$ film is conducted to form an SiO$_2$ pattern 68 of, e.g., 2 μm width by means of the wet etching method using BHF or the dryetching method using CF$_4$, for instance (see FIG. 13B).

Figure 13A:
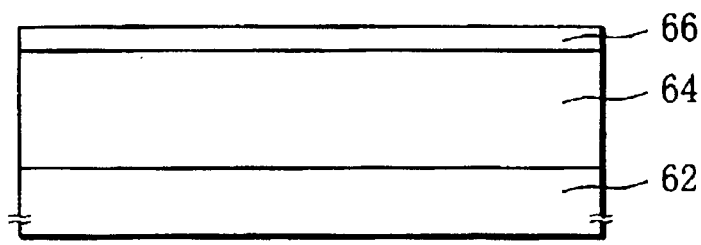
FIG. 13A is a section view showing a first process stage of a method for manufacturing the Schottky gate FET shown in FIG. 12.
Figure 13B:
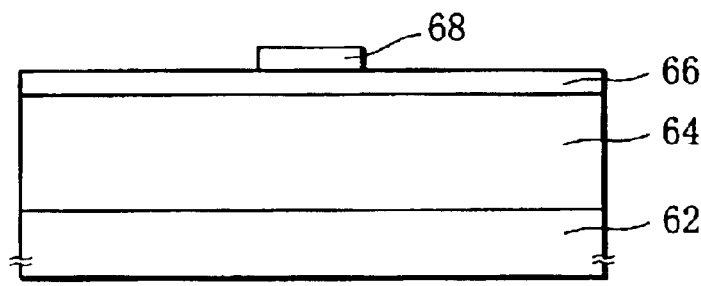
FIG. 13B is a section view of a second process stage of the manufacturing method.
Figure 13C:
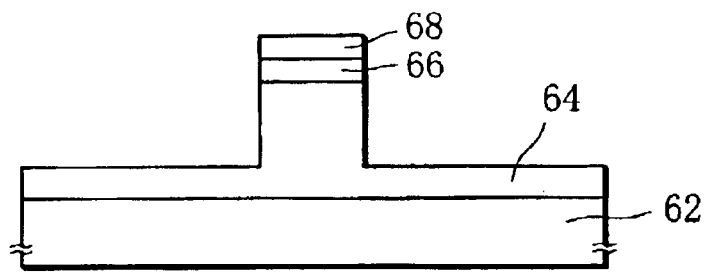
FIG. 13C is a section view of a third process stage.

Then, the n$^+$-type GaN layer 66 and the n-type GaN layer 64 are selectively removed by the ECR plasma etching method or the RIBE method using methane series gas, for instance, and using the SiO$_2$ pattern 68 as a mask, whereby a protrusion of 2000 nm height and 2000 nm width is formed on a central portion of a surface of the n-type GaN layer 18, with the n$^+$-type GaN layer 66 on the upper face of the protrusion kept remained (see FIG. 13C).

Figure 13D:
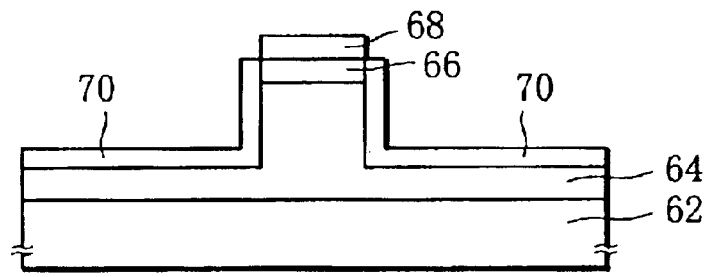
FIG. 13D is a section view of a fourth process stage.

Subsequently, an undoped $Al_{0.2}Ga_{0.8}N$ layer 70 of 30 nm thick is selectively grown using the SiO$_2$ pattern 68 as a mask and using, as material gasses, Ga, Al and NH$_3$ at partial pressures of $6.65 \times 10^{-5}$ Pa, $2.66 \times 10^{-5}$ Pa and $6.65 \times 10^{-4}$ Pa, respectively, whereby the surface of a flat portion and the side faces of protrusion of the n-type GaN layer 64 and side faces of the n$^+$-type GaN layer 66 are covered by the $Al_{0.2}Ga_{0.8}N$ layer 70 (see FIG. 13D).

Next, the SiO$_2$ pattern 68 is removed. In succession, by mean of the lift-off method, a TaSi layer is selectively formed on an upper face of the n$^+$-type GaN layer 66, to thereby forming a source electrode 72 that is constituted by a TaSi layer and forms an ohmic junction with the upper face of the protrusion of the n-type GaN layer 18 through the n$^+$-type GaN layer 66 (see FIG. 14A).

Next, by the lift-off method, a Pt layer is selectively formed on the $Al_{0.2}Ga_{0.8}N$ layer 70, thereby forming a Schottky gate electrode 74 that is constituted by a Pt layer and forms a Schottky junction with the side faces of the protrusion of the n-type GaN layer 64 through the $Al_{0.2}Ga_{0.8}N$ layer 70 (see FIG. 14B).

Next, a drain electrode 76 is formed, which is constituted by a TaSi layer and forms an ohmic junction with a rear face of the n-type SiC substrate 62. With the aforementioned series of processes, the fabrication of a Schottky gate FET 60 shown in FIG. 12 is completed.

According to the third embodiment, a vertical GaN-based Schottky gate FET 60 can be realized that has a basic construction such that the source electrode 72 forms an ohmic junction with the upper face of the protrusion of the n-type GaN layer 64, along which face a channel region is formed, and the Schottky gate electrode 74 forms a Schottky junction with the side faces of the protrusion, with the drain electrode 76 forming an ohmic junction with a rear face of the n-type SiC substrate 62.

In addition, the undoped $Al_{0.2}Ga_{0.8}N$ layer 70 having higher bandgap energy and provided between the side faces of the protrusion of the n-type GaN layer 64 and the Schottky gate electrode 74 produces the following advantages. That is, two-dimensional electron gasses are produced in the vicinity of a heterojunction between the n-type GaN layer 64 and the $Al_{0.2}Ga_{0.8}N$ layer contributes to the formation of a drain current $I_D$, making it possible to attain a proper rising characteristic of the drain current. Furthermore, the depletion layer is caused to expand widely due to the Schottky junction between the Schottky gate electrode 74 and the side faces of the protrusion of the n-type GaN layer 64, whereby the controllability of the drain current ID by means of the gate voltage $V_G$ is improved.

The Schottky gate FET 60 of the third embodiment may be modified in various manners.

For instance, instead of the $Al_{0.2}Ga_{0.8}N$ layer 70 in the Schottky gate FET 60, an undoped GaN layer of 50 nm thick may be provided between the Schottky gate electrode 74 and the side faces of the protrusion of the n-type GaN layer 64, whereby the degree of expansion of the deletion layer is further increased and the controllability of the drain current $I_D$ is improved.

FIG. 15 shows a vertical GaN-based Schottky gate FET 60A according to a second modification of the third embodiment. As compared with the FET 60 shown in FIG. 12, the FET 60A is different in that the $Al_{0.2}Ga_{0.8}N$ layer 70 is removed and the Schottky gate electrode 74 is directly joined to the side faces of the protrusion of the n-type GaN layer 64 so as to form a Schottky junction therewith, thus simplifying the construction.

Although the protrusions of the n-type GaN layers 18, 44 and 64 each have a width of 2000 nm, the width may be within a range of 5 nm to 10 μm, for instance. Preferably, the width has a value falling within a range of 10 nm to 5 μm, more preferably, within a range of 50 nm to 3 μm. As for crystal growth of a GaN-based III-V nitride semiconductor layer, the MOCVD method, hydride vapor growth method or the like may be used instead of the gas source MBE method. As for a heterojunction for producing two-dimensional gas, a heterojunction of a combination of III-V nitride semiconductor layers such as for example InGaN, AlInGaN, AlInGaNP, AlGaN, AlGaN may be employed instead of a GaN/AlGaN junction that is a combination of the n-type GaN layer 18, 64 and the AlGaN layer 22, 70.

Although an electrically conductive n-type SiC substrate 2, 62 is employed in the second and third embodiments and their modifications, a semiconductor substrate of SiC, Si, GaN, AlN, GaAs, GaP or the like may be used.

In the following, a horizontal GaN-based Schottky diode according to a fourth embodiment of the present invention will be explained.

As compared to the first to third embodiments having an n-type GaN layer whose surface portion is shaped to form a protrusion, the Schottky diode of the fourth embodiment is different therefrom mainly in that the n-type GaN layer has a flat face, thereby simplifying fabrication processes of the Schottky diode and eliminating influences of fabrication accuracy of side faces of such a protrusion upon a current-voltage characteristic of the Schottky diode.

Figure 16:
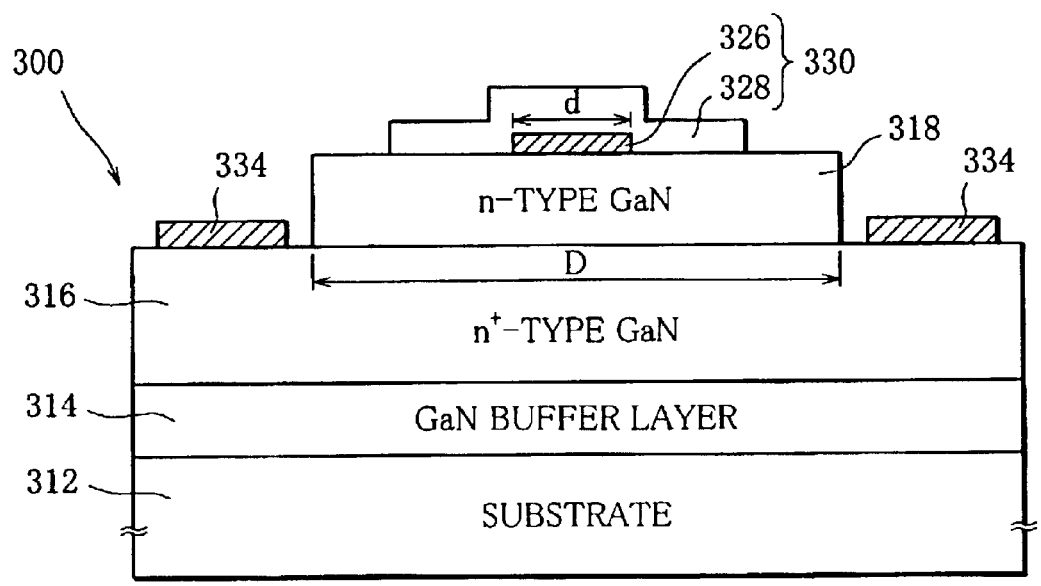
FIG. 16 is a schematic section view showing a GaN-based Schottky diode according to a fourth embodiment of the present invention.

As shown in FIG. 16, the horizontal GaN-based Schottky diode 300 of the fourth embodiment comprises an insulating or semi-insulating sapphire substrate 312, a GaN buffer layer 314 of 50 nm thick formed on the substrate 312, and an n⁺-type GaN layer 316 of 2000 nm thick formed on the buffer layer 314. On the GaN layer 316 is formed an n-type GaN layer 318 of 1000 nm thick having a predetermined width D (preferably not more than 6 μm, e.g., equal to 6 μm). The n-type GaN layer 318 has low impurity concentration of preferably not higher than $2\times10^{17}$ cm⁻³, e.g., about $2\times10^{17}$ cm⁻³.

The Schottky diode 300 further comprises a Ti electrode 326 that is disposed to form a Schottky junction with an upper face of the n-type GaN layer 318, with a junction width d (preferably 0.3 μm to 2 μm, e.g., 2 μm) narrower than the width D of the n-type GaN layer 318 and that serves as a first anode electrode; and a Pt electrode 328 that is formed on those portions of the Ti electrode 326, which are not covered by the Ti electrode 326, so as to form a Schottky junction therewith. The Pt electrode 328 electrically connected with the Ti electrode 326 serves as a second electrode, and cooperates with the Ti electrode 326 to form a combined anode electrode 330. On outer portions of the surface of the n⁺-type GaN layer 316, a cathode electrode 334 is provided that is constituted by TaSi layer and forms an ohmic junction with the n⁺-type GaN layer 316.

In the Schottky diode 10 having the above construction, a Schottky barrier formed between the Ti electrode 326 and the GaN layer 318 is lower in height than that formed between the Pt electrode 328 and the GaN layer 318, as in the case of the first to third embodiments.

Meanwhile, a material constituting the first anode electrode is not limited to Ti and may be metal such as W, Ag or the like that forms a Schottky barrier lower than 0.8 eV relative to the n-type GaN layer 318. A material constituting the second anode electrode is not limited to Pt and may be metal such as Au or the like that forms a Schottky barrier higher than 0.8 eV relative to the n-type GaN layer 318.

Next, a current-voltage characteristic of the GaN-based Schottky diode 300 shown in FIG. 16 will be explained.

When a forward bias was applied to between the combined anode electrode 330 and the cathode electrode 334, a proper rising was observed such that the forward current abruptly increased at an on-voltage of 0.1–0.3 volts. It is considered that such a proper forward-current rising characteristic can be obtained for the same reason as that mentioned in the first to third embodiments.

When a reverse bias was applied to between the combined anode electrode 330 and the cathode electrode 334, a high withstand voltage of about 500 volts was observed. It is considered that the reason why such a high withstand voltage can be obtained is as follows:

When a reverse bias is applied to the Schottky diode 300 of the fourth embodiment, a depletion layer expands towards the n⁺-type GaN layer 316 from an interface of the n-type GaN layer 318 which is in contact with the first and second anode electrodes (Ti and Pt electrodes 326, 328). When the reverse bias reaches or exceeds a predetermined value, the depletion layer expands through the entirety of the n-type GaN layer 318, resulting in a pinch-off state. Thus, a high withstand voltage can be attained as in the Schottky diodes according to the first to third embodiments.

The Schottky diode 300 (FIG. 16) of the fourth embodiment can be fabricated in substantially the same manner as that for the Schottky diode 10 (FIG. 1) of the first embodiment.

Briefly speaking, at first, as in the process stage shown in FIG. 2A, a GaN buffer layer 314 and an n⁺-type GaN layer 316 are sequentially layered on a sapphire substrate 312, and an n-type GaN layer 318 (FIG. 16) of 1000 nm thick is layered on the n⁺-type GaN layer 316 under the same conditions as those for the n-type GaN layer 18 shown in FIG. 2A. Then, processes similar to those shown in FIGS. 2E, 3A, 3B and 3C are conducted to form Ti and Pt electrodes 326, 328, and further a cathode electrode 334 is formed on the n⁺-type GaN layer 316, whereby the Schottky diode 300 shown in FIG. 16 is fabricated.

The Schottky diode 300, having the combined anode electrode 330 which is a combination of the Ti and Pt electrodes 326, 328 that form a Schottky junction with the n-type GaN layer 318, can simultaneously achieve a low on-voltage and a high withstand voltage.

The Schottky diode 300 of the fourth embodiment may be modified variously, as in the first to third embodiments.

For instance, an undoped $Al_{0.2}Ga_{0.8}N$ layer (not shown) with a high bandgap energy or an undoped GaN layer (not shown) may be interposed between the n-type GaN layer 318 and the Pt electrode 328, so as to improve a forward-current rising characteristic and/or a withstand voltage characteristic.

Although an n-type GaN layer 318 is layered on an n⁺-type GaN layer 316 in the fourth embodiment, a surface portion of the n⁺-type GaN layer 316 subjected to ion-injection may be utilized for the n-type GaN layer 318. This modification capable of making a surface of a semiconductor flat is advantageous for integration. In order to form the n-type GaN layer 318 in the n+-type GaN layer 316, ion-injection of C and/or Mg and/or Zn for compensation may be made to an opening formed in that portion of the n+-type GaN layer 316 in which the n-type GaN layer 318 is to be formed, with a surface of the remaining portion of the n+-type GaN layer 316 being masked.

In the following, a protection element according to a fifth embodiment of the present invention will be explained.

Figure 18:
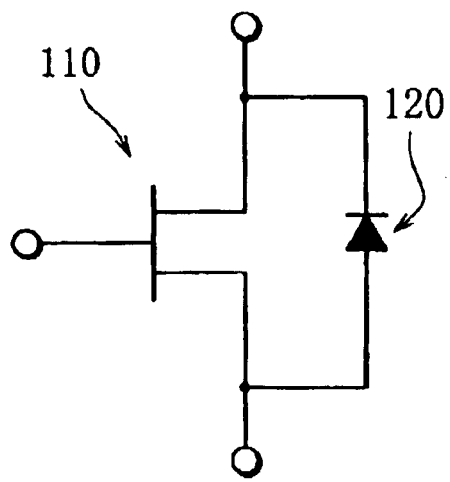
FIG. 18 is a schematic circuit diagram showing connection between a GaN-based Schottky diode serving as a protection element according to a fifth embodiment of the present invention and a power FET serving as a switching element.

Referring to FIG. 18, the protection element of the fifth embodiment, which serves to protect a power FET 110 serving as a switching element that constitutes a power conversion circuit of a power conversion apparatus, is constituted by a GaN-based Schottky diode 120 that is connected between the source and the drain of the power FET 110, which may be an Si-based MOSFET, a GaN-based metal insulator semiconductor FET (MESFET), or a GaN-based metal semiconductor FET (MESFET).

Figure 19:
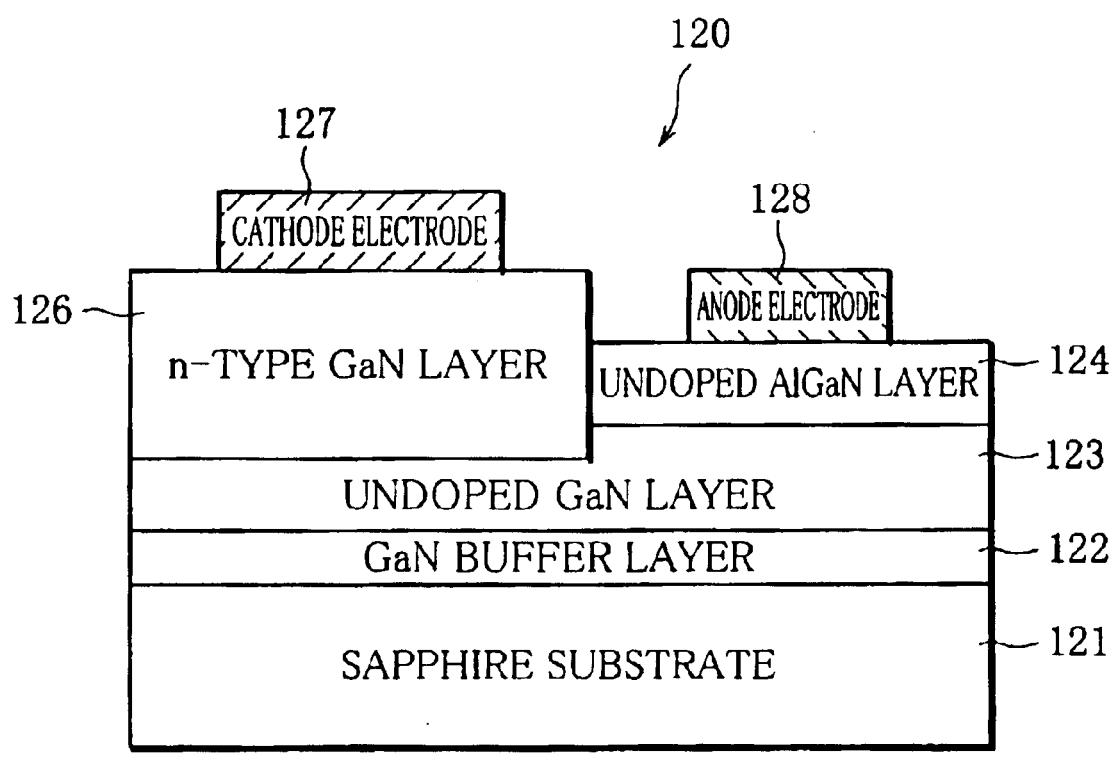
FIG. 19 is a schematic section view showing the Schottky diode according to the fifth embodiment.

As shown in FIG. 19, the Schottky diode 120, which has a horizontal structure, comprises an insulating or semi-insulating sapphire substrate 121 on which an undoped GaN layer 123 is formed, which layer is a III-V nitride semiconductor layer whose bandgap is wider than that of the GaN layer 123. Further, an n-type GaN layer 126 is formed on the GaN layer 123 so as to be connected to a heterojunction portion between the GaN layer 123 and the AlGaN layer 124. Two-dimensional electron gas is produced in the vicinity of the heterojunction face between the GaN layer 123 and the AlGaN layer 124. A cathode electrode 127 is formed on the n-type GaN layer 126 so as to form an ohmic junction therewith. Furthermore, an anode electrode 128 is formed on the AlGaN layer 124 so as to form a Schottky junction therewith.

Figure 20A:
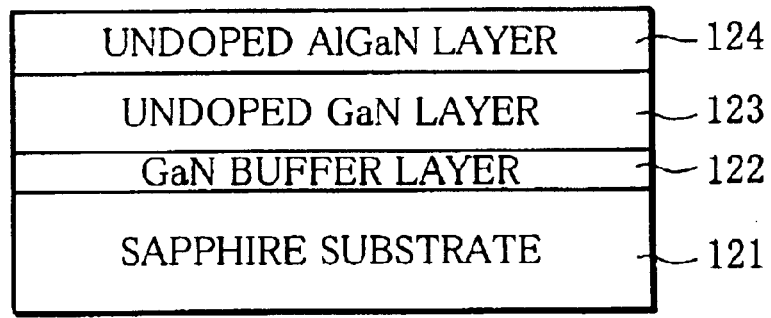
FIG. 20A is a section view showing a first process stage of a method for manufacturing the Schottky diode shown in FIG. 19.

Next, with reference to FIGS. 20A to 20C, an exemplified method for manufacturing the Schottky diode 120 shown in FIG. 19 will be explained.

First, a series of crystal growth is conducted on a sapphire substrate 121 at a growth temperature of 640° C. by mean of the gas source MBE method using, e.g., an ultra-high vacuum growth apparatus.

Specifically, a GaN buffer layer 122 of 5 nm thick is grown by using, as material gasses, Ga (gallium) and radical N (nitrogen) at partial pressures of $6.65 \times 10^{-5}$ Pa and $4.0 \times 10^{-4}$ Pa, respectively. In succession, an undoped GaN layer 123 of 3000 nm thick is grown by using Ga and $NH_3$ (ammonia) at partial pressures of $1.33 \times 10^{-4}$ Pa and $6.65 \times 10^{-4}$ Pa, respectively. In succession, an undoped AlGaN layer 124 of 30 nm thick is grown using Ga, Al and $NH_3$ individually at partial pressures of $6.65 \times 10^{-5}$ Pa, $2.66 \times 10^{-5}$ Pa and $6.65 \times 10^{-4}$ Pa, whereby a first intermediate product having a heterojunction of the GaN layer 123 and the AlGaN layer 124 is formed (see FIG. 20A).

For the series of crystal growth processes, the MOCVD method, halide vapor growth method or the like may be used instead of the gas source MBE method.

Next, after the first intermediate product is temporally taken out from the ultra-high vacuum growth apparatus, an $SiO_2$ film (or an $SiN_x$ film or an AlN film) is formed on the AlGaN layer 124 by using, e.g., a plasma CVD apparatus. In succession, the $SiO_2$ film is selectively removed by the wet etching method using BHF or the dryetching method using CF4, thereby forming an $SiO_2$ pattern 125 of the desired shape.

Figure 20B:
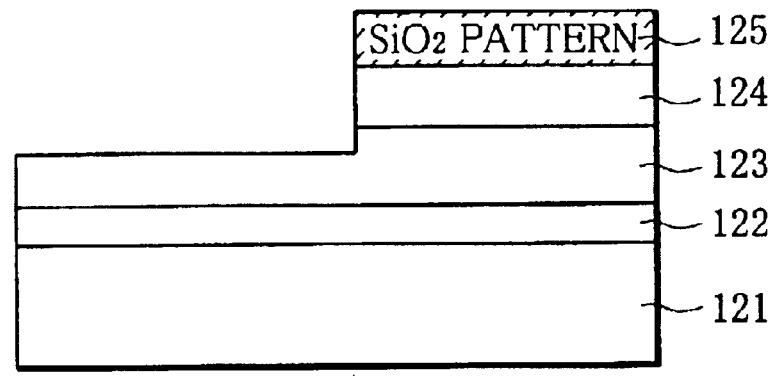
FIG. 20B is a section view of a second process stage of the manufacturing method.

Then, using the $SiO_2$ pattern 125 as a mask, the AlGaN layer 124 and the GaN layer 123 are selectively removed by the ECR plasma etching method or the RIBE method with a methane series gas, thus forming a second intermediate product in which a surface of the GaN layer 123 is partly exposed (see FIG. 20B).

Figure 20C:
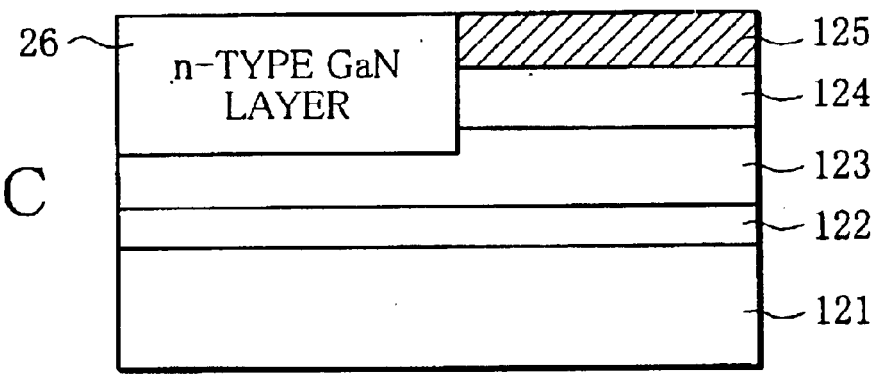
FIG. 20C is a section view of a third process stage.

Next, after the second intermediate product is mounted in the ultra-high vacuum growth apparatus, an n-type GaN layer 126 highly doped with Si at the concentration of about $5 \times 10^{19}$ cm$^{-3}$ is selectively grown on the exposed GaN layer 123, using the $SiO_2$ pattern 125 as a mask and using Ga, $NH_3$ and Si (serving as a dopant) individually at partial pressures of $6.65 \times 10^{-5}$ Pa, $6.65 \times 10^{-4}$ Pa and $1.33 \times 10^{-6}$ Pa, whereby a third intermediate product is formed in which the n-type GaN layer 126 is selectively grown on that portion of the GaN layer 123 which is adjacent to the AlGaN layer 124 (see FIG. 20C).

Next, the $SiO_2$ pattern 125 is removed after the third intermediate product is taken out from the ultra-high vacuum growth apparatus. In succession, an $SiO_2$ film (not shown) is formed on the entire face of the third intermediate product, and then the $SiO_2$ film is selectively removed by the photolithography and etching method, to form the $SiO_2$ film with a contact hole through which the n-type GaN layer 126 is exposed. Further, by mean of a sputter vapor method using, e.g., Ar plasma, TaSi and Au are deposited in sequence to thereby form a cathode electrode 127 (FIG. 19) of a TaSi/Au layered structure forming an ohmic junction with the n-type GaN layer 126.

Similarly, the $SiO_2$ film is selectively removed by etching to thereby form the $SiO_2$ film with contact hole through which the AlGaN layer 124 is exposed, and then Ti, WSi and Au are deposited in sequence, whereby an anode electrode 128 (FIG. 19) of a Ti/WSi/Au layered structure forming a Schottky junction with the AlGaN layer 124 is formed.

With the aforementioned series of processes, the Schottky diode 20 shown in FIG. 19 is fabricated.

As for a prototype GaN-based Schottky diode as shown in FIG. 19 that was fabricated by the present inventors in accordance with the aforementioned manufacturing method, the diode had a withstand voltage higher than 600 volts and an on-resistance not higher than 24 mΩcm$^2$, with the forward current risen at about 0.3 volts and the maximum current being 100 amperes.

Next, explanations will be given as to a power conversion apparatus having a power conversion circuit in which the power FET 10 and the GaN-based Schottky diode 20 shown in FIG. 18 are used as switching element and protection element, respectively. A power conversion circuit for a power conversion apparatus is generally constituted in the form of an inverter circuit or a converter circuit. The inverter and converter circuits can have a variety of circuit arrangements to meet various requirements on their control functions. In this regard, an exemplified power conversion apparatus including an inverter circuit is shown in FIG. 21, whereas four typical power conversion apparatuses each including a converter circuit are shown in FIGS. 22A through 22D.

Figure 21:
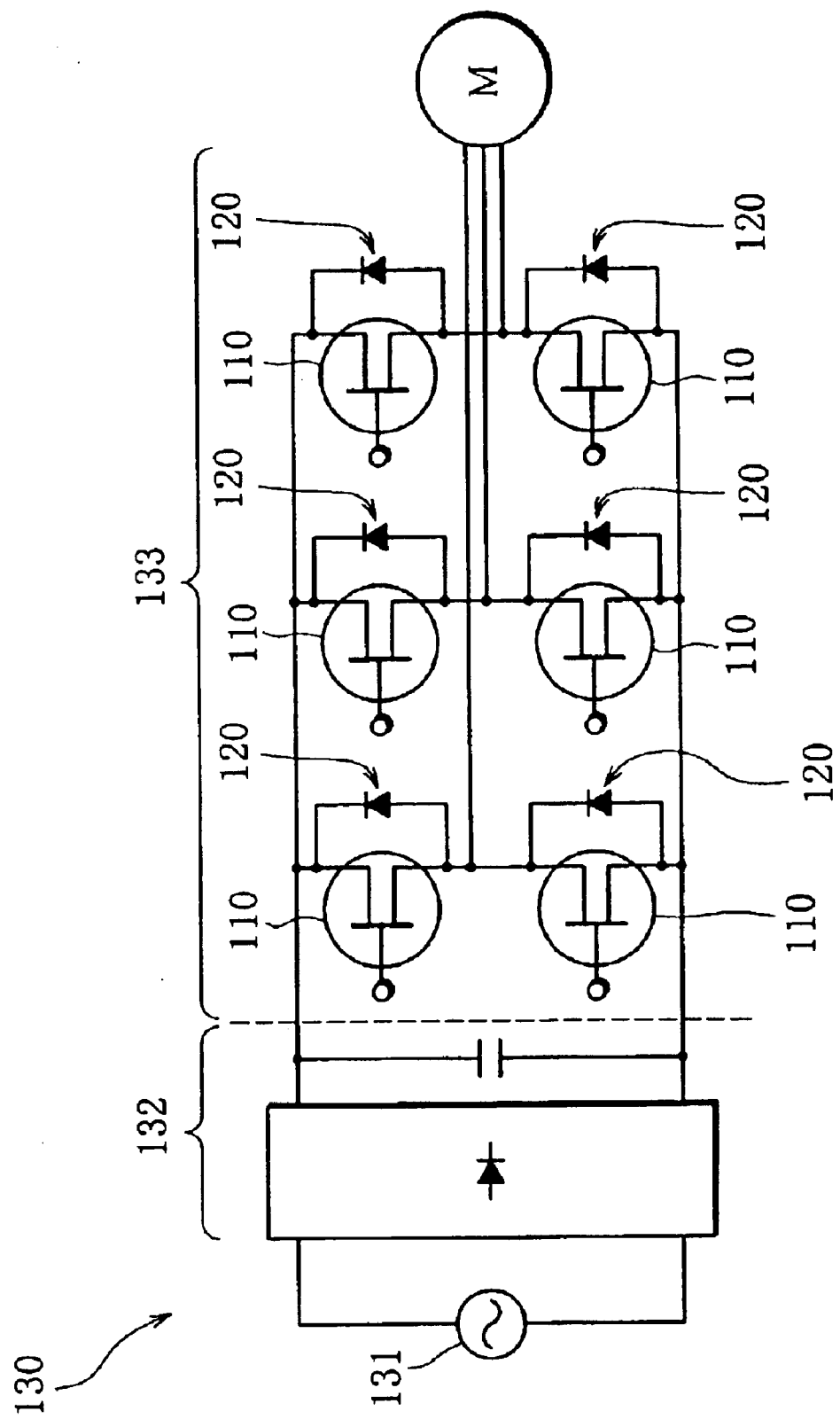
FIG. 21 is a circuit diagram showing an example of a power conversion apparatus comprised of an inverter circuit having the power FET and the Schottky diode shown in FIG. 18.
Figure 22A:
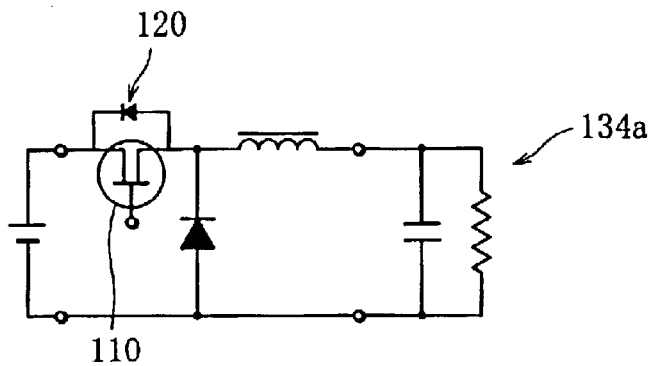
FIG. 22A is a circuit diagram showing a power conversion apparatus comprised of a converter circuit having the power FET and the Schottky diode shown in FIG. 18.
Figure 22B:
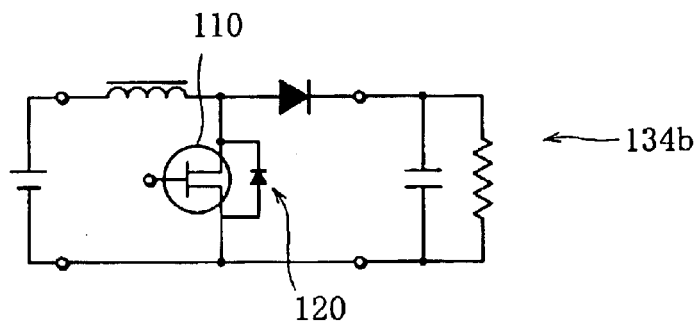
FIG. 22B is a circuit diagram of a power conversion apparatus comprised of another converter circuit.
Figure 22C:
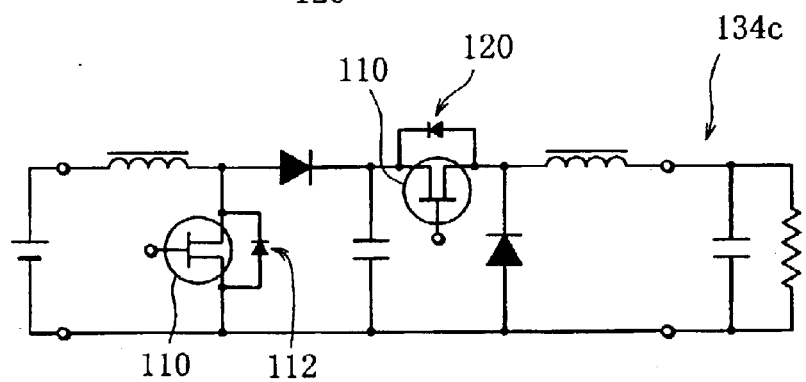
FIG. 22C is a circuit diagram of a power conversion apparatus comprised of still another converter circuit.
Figure 22D:
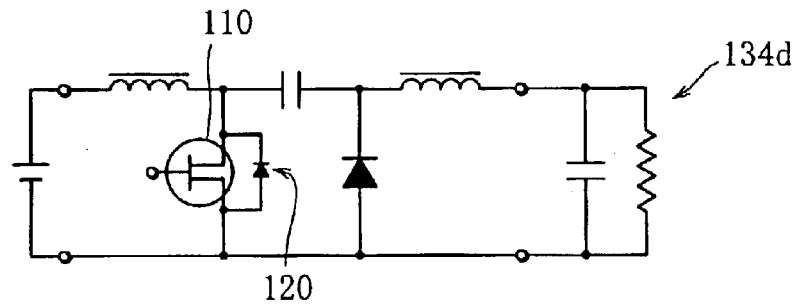
FIG. 22D is a circuit diagram of a power conversion apparatus comprised of still another converter circuit.

Referring to FIG. 21, a power conversion apparatus 130 comprises a 100V AC power source 131 operating at a frequency of 50 or 60 Hz, a rectifying circuit 132 for rectifying AC supplied from the AC power source to DC, and a DC-AC inverter circuit 133 for converting DC supplied from the rectifying circuit 132 to AC with a frequency of 1 kHz to 24 kHz, the AC from the DC-AC inverter circuit 133 being supplied to a load M.

On the other hand, power conversion apparatuses shown in FIGS. 22A to 22D are provided with DC-DC converter circuits 134a–134d, respectively, which are individually referred to as Buck circuit (step down type), Boost circuit (step up type), Boost-Buck circuit (step up/down type), and Cuk circuit (step up/down type).

The power FETs 110 serve as switching elements constituting the DC-AC inverter circuit 133 or each of the DC-DC converter circuits 134a–134d, and the GaN-based Schottky diode 120 serves as a protection element for the switching element.

Since the on-voltage of the Schottky diode 120 serving as the protection element of the power FET 110 (switching element) is about 0.3 volts, it is easy to operate the power FET 110 at a low on-voltage that is not greater than 1 volt. This makes it possible to lower a loss, thereby achieving a high inverter or converter efficiency to improve the efficiency of a power conversion apparatus.

When an inrush current or serge voltage is applied to the power FET 110 that starts to operate, the Schottky diode 120 serving as the protection element therefor exhibits a withstand voltage not smaller than 600 volts, thereby preventing the destruction of the power FET 110 due to heat generation therein. This ensures a stable operation of the power FET 110 and hence can improve the reliability of the power conversion apparatus.

Meanwhile, the Schottky diode 20 is preferably provided with an extremely thin insulating film of 10–24 nm thick made of $SiO_2$, SiN or the like between the AlGaN layer 24 and the gate electrode 28a or between the AlGaN layer 24 and the anode electrode 28b. This makes it possible to suppress the increase of leakage current even when the power FET 110 operates at a high current under a high withstand voltage.

The protection element according to the fifth embodiment may be modified variously.

For instance, instead of the GaN-based Schottky diode 120 shown in FIGS. 18 and 19, it is possible to use the GaN-based Schottky diode according to the first or second embodiment or its modification, or the GaN-based Schottky gate FET according to the third embodiment or its modification.

Figure 17:
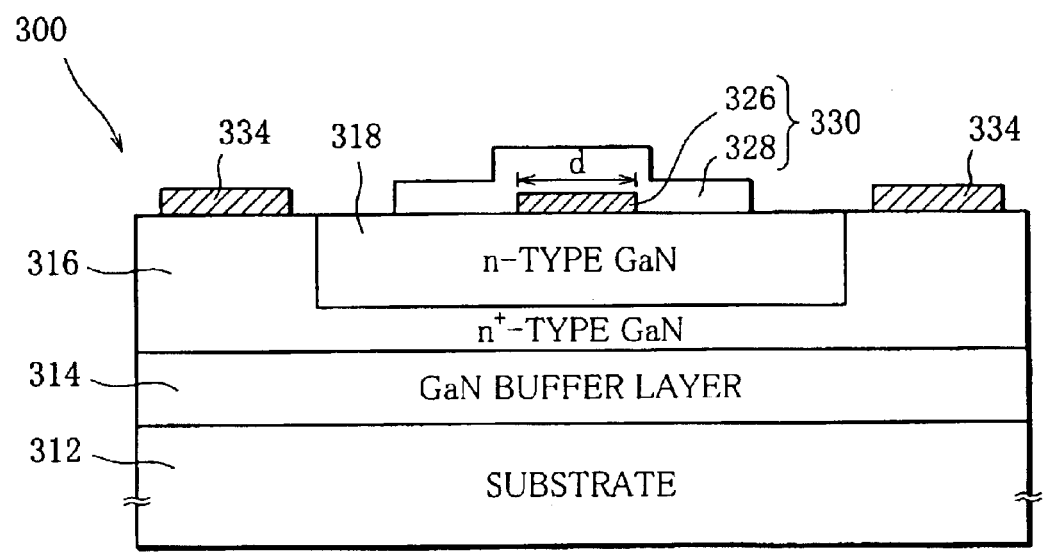
FIG. 17 is a schematic section view showing a modification of a Schottky diode shown in FIG. 16.

As explained above, each of the GaN-based Schottky diodes 10 (FIG. 1), 300 (FIG. 17) according to the first and fourth embodiments achieves a low on-voltage and a high withstand voltage as well as a proper forward-current rising characteristic and a proper voltage withstand characteristic. Thus, when employed as the protection element for the power FET 110 constituting an inverter or converter circuit of a power conversion apparatus, the Schottky diodes 10, 30 can lower a loss, thereby permitting a high inverter or converter efficiency to be achieved to increase the efficiency of the power conversion apparatus. Further, the Schottky diodes 10, 300 having a high withstand voltage ensure a stable operation of the power FET 110 to improve the reliability of the power conversion apparatus.

The vertical GaN-based Schottky diode 40 (FIG. 10) of the second embodiment is designed to have substantially the same characteristic as that of the horizontal GaN-based Schottky diode 10 (FIG. 1) of the first embodiment, and therefore, the Schottky diode 40 when employed as the protection element for the power FET 110 can achieve advantages similar to those of the Schottky diode 10.

The Schottky diodes according to the respective first modifications of the first and second embodiments each have a proper withstand voltage characteristic, the Schottky diodes 10A (FIG. 5), 40 (FIG. 8) according to the respective second modifications of the first and second embodiments can achieve substantially the same characteristics as those of the Schottky diode 10 (FIG. 10) with a simplified construction, and the Schottky diodes 10B (FIG. 6), 40B (FIG. 10) according to the respective third modifications of the first and second embodiments can increase the forward current. Accordingly, each of these Schottky diodes when employed as the protection element for the power FET 110 can achieve advantages that are equivalent or superior to those achieved by the Schottky diode 10.

The Schottky diodes according to the fourth and fifth modifications of the first and second embodiments correspond to a combination of the first and third modifications and a combination of the second and third modifications of the first and second embodiments, respectively, and therefore, each of these Schottky diodes as the protection element can achieve advantages equivalent or superior to those achieved by the Schottky diode according to the first, second or third modification of the first or second embodiment.

The vertical GaN-based Schottky gate FET 60 (FIG. 12) according to the third embodiment comprises a proper drain current ID rising characteristic and a proper drain current $I_D$ controllability by the gate voltage $V_G$. Accordingly, the Schottky gate FET 60 when employed as the protection element for the power FET 110 can decrease a loss and increase the inverter or converter efficiency, thereby improving the efficiency of a power conversion apparatus.

The Schottky gate FET according to the first modification of the third embodiment comprises a drain current controllability superior to that of the third embodiment, whereas the Schottky gate FET according to the second modification of the third embodiment can achieve substantially the same characteristics as those of the third embodiment with a simplified construction. Therefore, each of these Schottky gate FETs used as the protection element can achieve advantages equivalent or superior to those achieved by the Schottky gate FET of the third embodiment.

Figure 23:
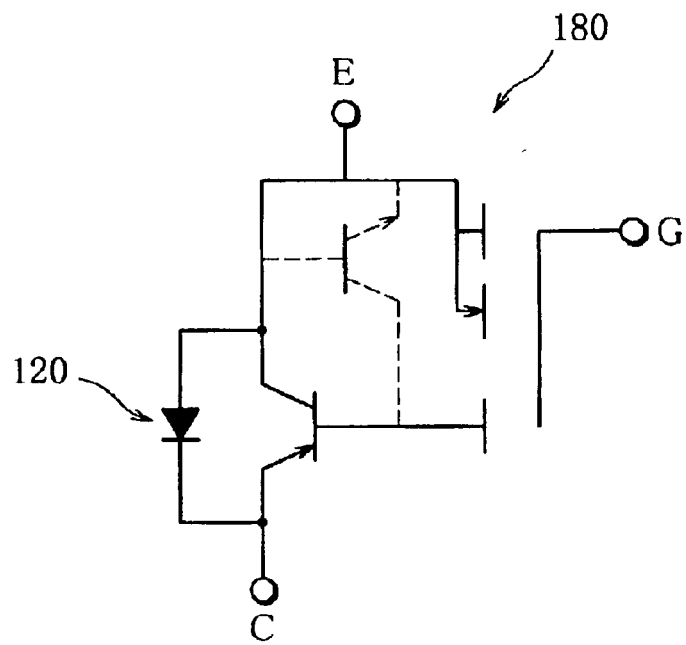
FIG. 23 is a schematic circuit diagram showing a combination of a GaN-based Schottky diode and an IGBT according to a modification of the fifth embodiment.

FIG. 23 shows a further modification of the fifth embodiment in which an IGBT 180 is employed as a switching element instead of the power FET 110 used in the fourth embodiment, and a GaN-based Schottky diode shown in FIG. 18 and serving as a protection element is connected between the emitter and collector of the IGBT 180.

As shown in FIGS. 21 and 22A–22D, the Schottky diode 120 and the IGBT 180 can be mounted on an inverter or converter circuit of a power conversion apparatus, as in the case of the Schottky diode 120 and the power FET 110 according to the fifth embodiment.

The Schottky diode 120 has a withstand voltage exceeding 600 volts, and therefore, the IGBT is operable at a high current not smaller than 100 amperes under a high withstand voltage of 500 volts or more. The IGBT 180 is prevented from being destroyed due to heat generation before the Schottky diode 120 starts to a protecting operation, whereby a stable operation and reliability of the power conversion apparatus is ensured.

Meanwhile, instead of the GaN-based Schottky diode 120, the aforementioned GaN-base Schottky diodes and the GaN-based Schottky gate FETs can be used as the protection element.

In the following, a protection element according to a sixth embodiment of the present invention will be described.

Figure 24:
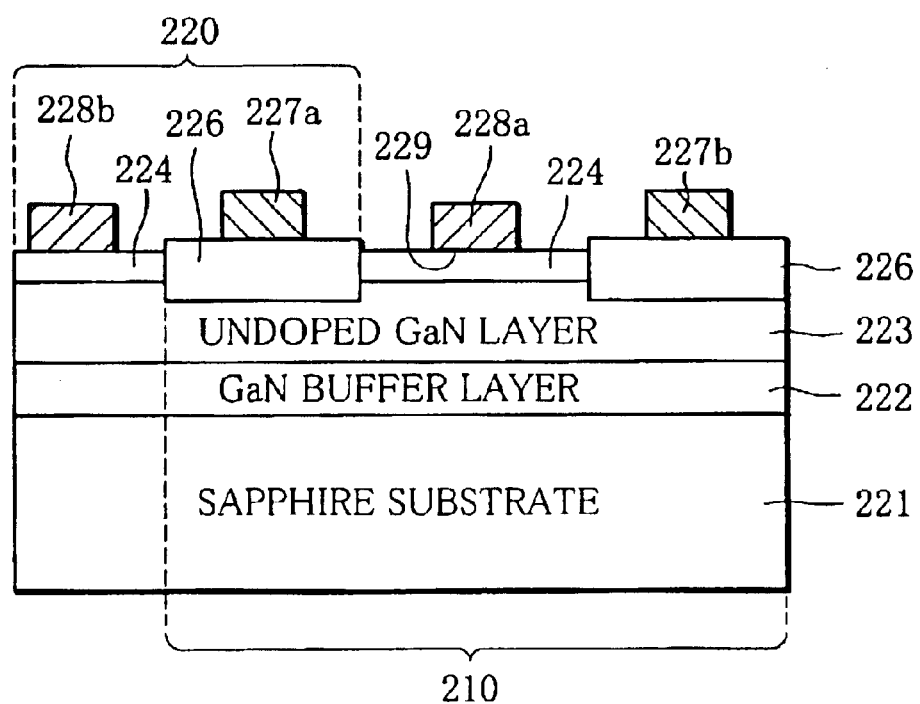
FIG. 24 is a schematic section view showing a GaN-based MESFET serving as a switching element and accommodating therein a GaN-based Schottky diode serving as a protection element according to a sixth embodiment of the present invention.

As shown in FIG. 24, the protection element of the sixth embodiment is constituted by a GaN-based Schottky diode 220 that is accommodated in a GaN-based MESFET 210 serving as a switching element and that is connected between the source and drain of the MESFET 210, to thereby serve to protect the MESFET 210.

The MESFET 210 and the Schottky diode 220 are integrated on the same substrate. More specifically, a GaN buffer layer 222, an undoped GaN layer 223 and an undoped AlGaN layer 224 are sequentially layered on a sapphire substrate 221, for instance, and two n-type GaN layers 226 are formed on the GaN layer 223 and connected to the heterojunction between the GaN layer 223 and the AlGaN layer 224.

Further, a dual-purpose source and cathode electrode (hereinafter referred to as source/cathode electrode) 227a and a drain electrode 227 are so formed as to form ohmic junctions with the two n-type GaN layers 226, respectively. A gate electrode 228a is formed on the AlGaN layer 224, interposed between the two n-type GaN layer 226, so as to form a Schottky junction therewith. An anode electrode 228b is formed on that portion of the AlGaN layer 224 which is located on the side opposite the gate electrode 228a, so as to form a Schottky junction therewith, with the source/cathode electrode 227a interposed between the anode and gate electrodes.

Next, with reference to FIGS. 25A–25C, an exemplified method for manufacturing the MESFET 210 and the Schottky diode 220 shown in FIG. 23 will be explained.

Figure 25A:
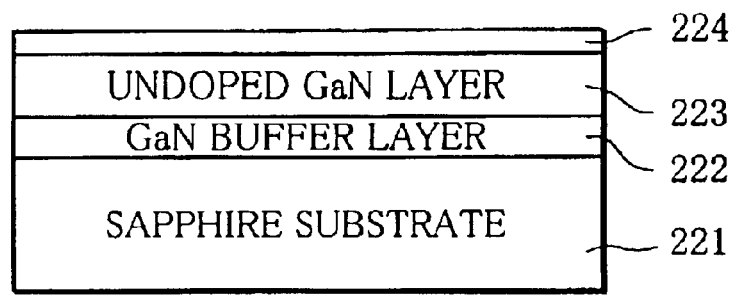
FIG. 25A is a section view showing a first process stage of a method for manufacturing the MESFET that accommodates therein the Schottky diode shown in FIG. 24.

First, a GaN buffer layer 222 of 5 nm thick, an undoped GaN layer 223 of 3000 nm thick, and an undoped AlGaN layer 224 of 30 nm thick are sequentially crystal-grown on a semi-insulating sapphire substrate 221, whereby a heterojunction structure of the GaN layer 223 and the AlGaN layer 224 is formed (see FIG. 25A).

Figure 25B:
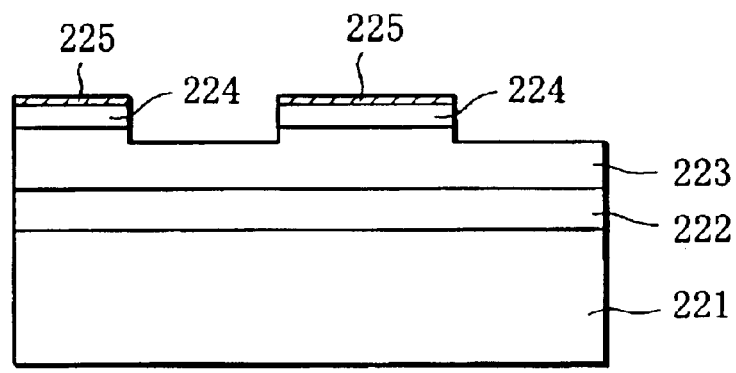
FIG. 25B is a section view of a second process stage of the manufacturing method.
Figure 25C:
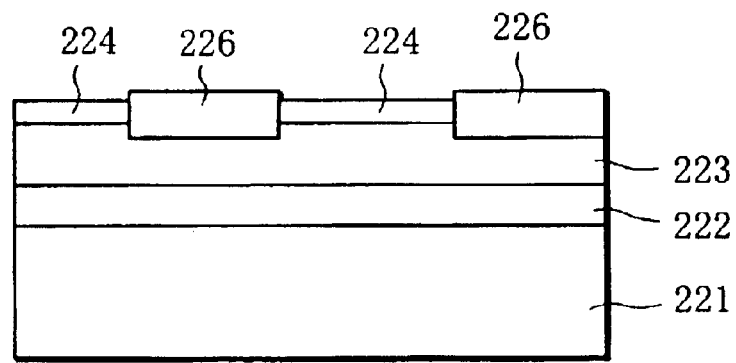
FIG. 25C is a section view of a third process stage.

Next, an $SiO_2$ film formed on the AlGaN layer 224 is selectively removed by etching so as to form an $SiO_2$ pattern 225 formed with two openings, and then, using the $SiO_2$ pattern 225 as a mask, the AlGaN layer 224 and the GaN layer 223 are selectively removed by etching in sequence, so as to cause a surface of the GaN layer 223 to be exposed (see FIG. 25B).

Subsequently, two n-type GaN layers 226 highly doped with an Si at the concentration of about $5 \times 10^{19}$ $cm^{-3}$ are grown on the two exposed surface portions of the GaN layer 223 (see FIG. 25C).

Then, a source/cathode electrode 227a and a drain electrode 227b each constituted by a TaSi/Au layered structure are formed on the two n-type GaN layers 226 so as to form an ohmic junction therewith. A gate electrode 228 of a Ti/WSi/Au layered structure is formed on the AlGaN layer 224 interposed between the two n-type GaN layers 226 so as to form a Schottky junction therewith, and an anode electrode 228 of a Ti/WSi/Au layered structure is formed on that portion of the AlGaN layer 224 which is located on the side opposite the gate electrode 228a so as to form a Schottky junction therewith, with the source/cathode electrode 227a interposed between the gate and anode electrodes (see FIG. 25C).

With the aforementioned series of processes, a GaN-base semiconductor device, shown in FIG. 24 and having the GaN-MESFET 210 and the GaN-based Schottky diode 220 integrated on the same substrate, is fabricated.

As explained above, the MESFET 210 and the Schottky diode 220 are simultaneously formed in a common process with use of a common material, and therefore, the Schottky diode 220 can be fabricated only by modifying a mask pattern used for selective etching and crystal grown for the fabrication of the MESFET 210. This does not require making the fabrication process complicated and implementing additional fabrication processes. As compared to a case of connecting the MESFET 210 (switching element) and the Schottky diode 220 (protection element) that are fabricated separately from each other, not only fabrication costs can be reduced, but also component parts can be made compact by integration to reduce the size of a power conversion apparatus.

The Schottky diode 220 and the MESFET 210 can be mounted to an inverter or converter circuit of a power conversion apparatus as shown in FIGS. 21 and 22A–22C, as in the case of the Schottky diode 120 and the power FET 110 according to the fifth embodiment. With such a power conversion apparatus that is high in inverter or converter efficiency, a significant reduction can be achieved in chip area of the MESFET 210 in which the Schottky diode 220 is accommodated, as compared to an Si-based MOSFET accommodating a conventional zener diode of pn-junction structure with the same performance, and the required number of FETs constituting an inverter or converter circuit can be reduced significantly, making it possible to extremely reduce the size of the power conversion apparatus.

As for a prototype MESFET 210 accommodating a Schottky diode 220 as shown in FIG. 24, the chip area could be reduced to 16 $mm^2$ from 1 $cm^2$ for an Si-based MOSFET accommodating a conventional zener diode of pn-junction structure with same performance, the required number of chips constituting an inverter circuit could be reduced to half of that for the conventional case, and the required number of chips constituting a converter circuit could be reduced to 8 from 32 for the conventional case.

The protection element according to the sixth embodiment can be modified variously. For instance, although the case where the MESFET 210 and the Schottky diode 220 are integrated on the same substrate has been described in the sixth embodiment, a Schottky diode according to the first or second embodiment or its modification may be integrated with the MESFET 210.

What is claimed is:

1. A GaN-based semiconductor device comprising:
   a III-V nitride semiconductor layer having a predetermined width;
   a first anode electrode forming a Schottky junction with said III-V nitride semiconductor layer, with a junction width narrower than the predetermined width of said III-V nitride semiconductor layer; and
   a second anode electrode forming a Schottky junction with a portion of said III-V nitride semiconductor layer other than a portion at which said first anode electrode is in contact with said III-V nitride semiconductor layer, said second anode electrode being electrically connected with said first anode electrode, a Schottky barrier formed between said first anode electrode and said III-V nitride semiconductor layer being lower in height than that formed between said second anode electrode and said III-V nitride semiconductor layer.

2. The GaN-based semiconductor device according to claim 1, wherein said first anode electrode has a width varying from 0.3 $\mu m$ to 2 $\mu m$.

3. The GaN-based semiconductor device according to claim 1, wherein the predetermined width of said III-V nitride semiconductor layer is equal to or less than 6 $\mu m$.

4. A GaN-based semiconductor device comprising:
   a III-V nitride semiconductor layer having a surface portion thereof shaped to form a protrusion;
   a first anode electrode forming a Schottky junction with an upper face of the protrusion of said III-V nitride semiconductor layer; and
   a second anode electrode forming a Schottky junction with a side face of the protrusion of said III-V nitride semiconductor layer and electrically connected with said first anode electrode, a Schottky barrier formed between said first anode electrode and said III-V nitride semiconductor layer being lower in height than that formed between said second anode electrode and said III-V nitride semiconductor layer.

5. The GaN-based semiconductor device according to any one of claims 1–4, wherein said first anode electrode is constituted by any one of Ti, W, and Ag.

6. The GaN-based semiconductor device according to any one of claims 1–4, wherein said second anode electrode is constituted by any one of Pt, Ni, Pd, and Au.

7. The GaN-based semiconductor device according to any one of claims 1–4, wherein said III-V nitride semiconductor layer has a carrier concentration equal to or less than $2\times10^{17}$ cm$^{-3}$.

8. The GaN-based semiconductor device according to claim 7, further comprising:
a semiconductor layer interposed between the upper face of the protrusion of said III-V nitride semiconductor layer and said first anode electrode and having a carrier concentration higher than that of said III-V nitride semiconductor layer.

9. The GaN-based semiconductor device according to any one of claims 1–4, wherein the Schottky barrier formed between said first anode electrode and said III-V nitride semiconductor layer is lower in height than 0.8 eV, and the Schottky barrier between said second anode electrode and said III-V nitride semiconductor layer is higher in height than 0.8 eV.

10. The GaN-based semiconductor device according to claim 4, further comprising:
a III-V nitride semiconductor layer formed between the side face of the protrusion of said III-V nitride semiconductor layer and said second anode electrode and having bandgap energy higher than that of said III-V nitride semiconductor layer.

11. The GaN-based semiconductor device according to claim 4, further comprising:
an undoped III-V nitride semiconductor layer formed between the side face of the protrusion of said III-V nitride semiconductor layer and said second anode electrode.

12. The GaN-based semiconductor device according to any one of claims 1–4, further comprising:
an insulating or semi-insulating substrate,
wherein a cathode electrode is formed on said III-V nitride semiconductor layer so as to form an ohmic junction therewith.

13. The GaN-based semiconductor device according to claim 12, further comprising:
a III-V nitride semiconductor layer formed between said III-V nitride semiconductor layer and said cathode electrode and having an electrical conductivity higher than that of said III-V nitride semiconductor layer.

14. The GaN-based semiconductor device according to any one of claims 1–4, further comprising:
an electrically conductive substrate,
wherein a cathode electrode is formed on a rear face of said electrically conductive substrate so as to form an ohmic junction therewith.

15. The GaN-based semiconductor device according to claim 12, 13 or 14, wherein said cathode electrode is constituted by TaSi.

16. The GaN-based semiconductor device according to any one of claims 1–4, wherein said III-V nitride semiconductor layer has surface portions thereof shaped to form protrusions,
said first anode electrode is formed on respective upper faces of the protrusions so as to form a Schottky junction therewith, and
said second anode electrode is formed on respective side faces of the protrusions so as to form a Schottky junction therewith.

17. The GaN-based semiconductor device according to claim 4, wherein the protrusion of said III-V nitride semiconductor layer has a width that is not smaller than 5 nm and not larger than 10 µm.

18. A III-V nitride semiconductor device comprising:
an electrically conductive substrate;
a III-V nitride semiconductor layer formed on said substrate and having a surface portion thereof shaped to form a protrusion;
a source electrode formed on an upper face of the protrusion of said III-V nitride semiconductor layer so as to form an ohmic junction therewith;
a gate electrode formed on a side face of the protrusion so as to form a Schottky junction therewith; and
a drain electrode formed on a rear face of said substrate so as to form an ohmic junction therewith.

19. The semiconductor device according to claim 18, wherein said III-V nitride semiconductor layer has a carrier concentration not higher than $2\times10^{17}$ cm$^{-3}$.

20. The semiconductor device according to claim 18, further comprising:
a III-V nitride semiconductor layer formed between the side face of the protrusion of said III-V nitride semiconductor layer and said gate electrode and having bandgap energy higher than that of said III-V nitride semiconductor layer.

21. The semiconductor device according to claim 18, further comprising:
an undoped III-V nitride semiconductor layer formed between the side face of the protrusion of said III-V nitride semiconductor layer and said gate electrode.

22. The semiconductor device according to claim 18, further comprising:
a III-V nitride semiconductor layer formed between said III-V nitride semiconductor layer and said source electrode and having an electrical conductivity higher than that of said III-V nitride semiconductor layer.

23. The semiconductor device according to claim 18, wherein the protrusion of said III-V nitride semiconductor layer has a width that is not smaller than 5 nm and is not larger than 10 µm.

* * * * *